(12) United States Patent
Ui

(10) Patent No.: US 10,498,994 B2
(45) Date of Patent: Dec. 3, 2019

(54) SOLID-STATE IMAGING ELEMENT AND CAMERA SYSTEM

(71) Applicant: Sony Corporation, Tokyo (JP)

(72) Inventor: Hiroki Ui, Tokyo (JP)

(73) Assignee: Sony Corporation, Tokyo (JP)

( * ) Notice: Subject to any disclaimer, the term of this patent is extended or adjusted under 35 U.S.C. 154(b) by 45 days.

(21) Appl. No.: 15/426,826

(22) Filed: Feb. 7, 2017

(65) Prior Publication Data

US 2017/0150082 A1 May 25, 2017

Related U.S. Application Data

(60) Continuation of application No. 13/953,194, filed on Jul. 29, 2013, now Pat. No. 9,621,834, which is a
(Continued)

(30) Foreign Application Priority Data

Jul. 18, 2008 (JP) ................................. 2008-187026

(51) Int. Cl.
*H04N 5/378* (2011.01)
*H04N 5/3745* (2011.01)
(Continued)

(52) U.S. Cl.
CPC ... *H04N 5/37457* (2013.01); *H01L 27/14627* (2013.01); *H01L 27/14643* (2013.01); *H04N 5/35545* (2013.01); *H04N 5/378* (2013.01)

(58) Field of Classification Search
CPC .......... H04N 5/37457; H04N 2209/045; H01L 27/14621; H01L 27/14641
See application file for complete search history.

(56) References Cited

U.S. PATENT DOCUMENTS 5,416,213 A 5/1995 Hasegawa et al.
5,920,274 A * 7/1999 Gowda ................. H03M 1/123
341/155
(Continued)

FOREIGN PATENT DOCUMENTS

JP 02-050584 A 2/1990
JP 2125710 A 5/1990
(Continued)

OTHER PUBLICATIONS

Japanese Office Action dated Apr. 22, 2010 for corresponding Japanese Application No. 2008-187026.
(Continued)

*Primary Examiner* — Thanh Luu
(74) *Attorney, Agent, or Firm* — Wolf, Greenfield & Sacks, P.C.

(57) ABSTRACT

Disclosed herein is a solid-state imaging element including a pixel unit configured to include a plurality of pixels arranged in a matrix and a pixel signal readout unit configured to include an analog-digital conversion unit that carries out analog-digital conversion of a pixel signal read out from the pixel unit. Each one of the pixels in the pixel unit includes a plurality of divided pixels arising from division into regions different from each other in optical sensitivity or a charge accumulation amount. The pixel signal readout unit reads out divided-pixel signals of the divided pixels in the pixel. The analog-digital conversion unit carries out analog-digital conversion of the divided-pixel signals that are read out and adds the divided-pixel signals to each other to obtain a pixel signal of one pixel.

20 Claims, 18 Drawing Sheets

Related U.S. Application Data division of application No. 12/457,755, filed on Jun. 19, 2009, now Pat. No. 8,525,906.

(51) Int. Cl.
*H04N 5/355* (2011.01)
*H01L 27/146* (2006.01)

(56) References Cited

U.S. PATENT DOCUMENTS

| | | |
|---|---|---|
| 6,115,066 A | 9/2000 | Gowda et al. |
| 6,346,696 B1* | 2/2002 | Kwon .................. H04N 5/3765 250/208.1 |
| 6,657,665 B1 | 12/2003 | Guidash |
| 6,750,437 B2 | 6/2004 | Yamashita et al. |
| 6,970,196 B1 | 11/2005 | Ishikawa et al. |
| 7,521,661 B2 | 4/2009 | Asaba |
| 8,525,906 B2 | 9/2013 | Ui |
| 2002/0036257 A1 | 3/2002 | Yamashita et al. |
| 2004/0100570 A1 | 5/2004 | Shizukuishi |
| 2005/0151873 A1 | 7/2005 | Murakami |
| 2005/0195304 A1 | 9/2005 | Nitta et al. |
| 2005/0231606 A1 | 10/2005 | Suzuki |
| 2005/0280728 A1 | 12/2005 | Ishikawa et al. |
| 2006/0012507 A1 | 1/2006 | Nitta et al. |
| 2006/0043440 A1* | 3/2006 | Hiyama ............ H01L 27/14603 257/291 |
| 2006/0050162 A1 | 3/2006 | Nakamura |
| 2006/0284999 A1 | 12/2006 | Muramatsu et al. |
| 2007/0035653 A1 | 2/2007 | Hong et al. |
| 2007/0091191 A1 | 4/2007 | Oike |
| 2007/0120990 A1 | 5/2007 | Sato et al. |
| 2007/0165123 A1 | 7/2007 | Panicacci |
| 2007/0285526 A1 | 12/2007 | Mann et al. |
| 2007/0296843 A1* | 12/2007 | Kasuga ............... H01L 27/1462 348/294 |
| 2008/0012969 A1 | 1/2008 | Kasai et al. |
| 2008/0173794 A1 | 7/2008 | Oike et al. |
| 2008/0225145 A1 | 9/2008 | Sonoda |
| 2008/0225149 A1 | 9/2008 | Rossi |
| 2008/0252742 A1 | 10/2008 | Oike |
| 2008/0258042 A1* | 10/2008 | Krymski ................ H04N 3/155 250/208.1 |
| 2008/0259178 A1 | 10/2008 | Oike |
| 2009/0002528 A1 | 1/2009 | Manabe et al. |
| 2009/0200451 A1* | 8/2009 | Conners ............... H04N 5/2351 250/208.1 |
| 2010/0013969 A1 | 1/2010 | Ui |
| 2010/0066875 A1 | 3/2010 | Hashimoto |
| 2010/0245628 A1 | 9/2010 | Hashimoto |
| 2010/0277607 A1 | 11/2010 | Choi et al. |
| 2013/0313411 A1 | 11/2013 | Ui |

FOREIGN PATENT DOCUMENTS

| | | |
|---|---|---|
| JP | 03-117281 A | 5/1991 |
| JP | 09-205589 A | 8/1997 |
| JP | 2000-059687 A | 2/2000 |
| JP | 2004-320119 A | 11/2004 |
| JP | 2005-278135 A | 10/2005 |
| JP | 2006-033454 A | 2/2006 |

OTHER PUBLICATIONS

European Search Report dated Jun. 10, 2014 for corresponding European Application No. 09251810.9-1902.
Korean Office Action dated May 15, 2015 for corresponding Korean Application No. 10-2009-0065259 and English translation thereof.
U.S. Appl. No. 12/457,755, filed Jun. 19, 2009, Ui.
U.S. Appl. No. 13/953,194, filed Jul. 29, 2013, Ui.

* cited by examiner

※ ONE PIXEL IS DIVIDED INTO FOUR DIVIDED PIXELS AND SENSITIVITY OR ACCUMULATION TIME IS MADE DIFFERENT FOR EACH DIVIDED PIXEL.

FIG.15

※ EXAMPLE IN WHICH HIGHER RESOLUTION IS ASSIGNED TO SMALLER LIGHT AMOUNT SIDE AND LOWER RESOLUTION IS ASSIGNED LARGER LIGHT AMOUNT SIDE

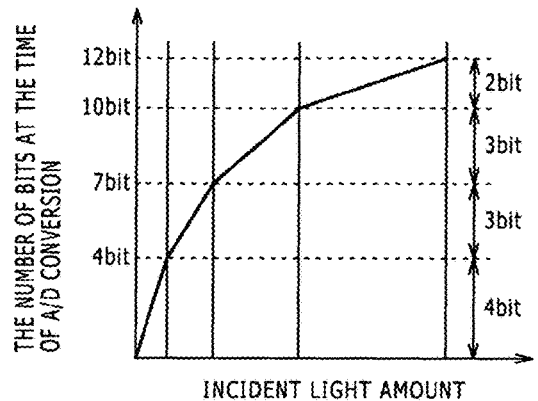

FIG.16

RESOLUTIONS THAT CAN BE SET FOR DIVIDED PIXELS AND THE TOTAL NUMBER OF CLOCKS (LOWEST RESOLUTION IS ASSUMED TO BE 1 BIT)

| THE NUMBER OF BITS THAT CAN BE SET FOR A (B, C, D) | THE NUMBER OF BITS THAT CAN BE SET FOR B (C, D, A) | THE NUMBER OF BITS THAT CAN BE SET FOR C (D, A, B) | THE NUMBER OF BITS THAT CAN BE SET FOR D (A, B, C) | THE NUMBER OF CLOCKS FOR FOUR PIXELS |
|---|---|---|---|---|
| 9 | 1 | 1 | 1 | 518 |
| 8 | 2 | 1 | 1 | 264 |
| 7 | 3 | 1 | 1 | 144 |
| 7 | 2 | 2 | 1 | 138 |
| 6 | 4 | 1 | 1 | 84 |
| 6 | 3 | 2 | 1 | 78 |
| 6 | 2 | 2 | 2 | 76 |
| 5 | 5 | 1 | 1 | 68 |
| 5 | 4 | 2 | 1 | 54 |
| 5 | 3 | 3 | 1 | 50 |
| 5 | 3 | 2 | 2 | 48 |
| 4 | 4 | 3 | 1 | 42 |
| 4 | 4 | 2 | 2 | 40 |
| 4 | 3 | 3 | 2 | 36 |

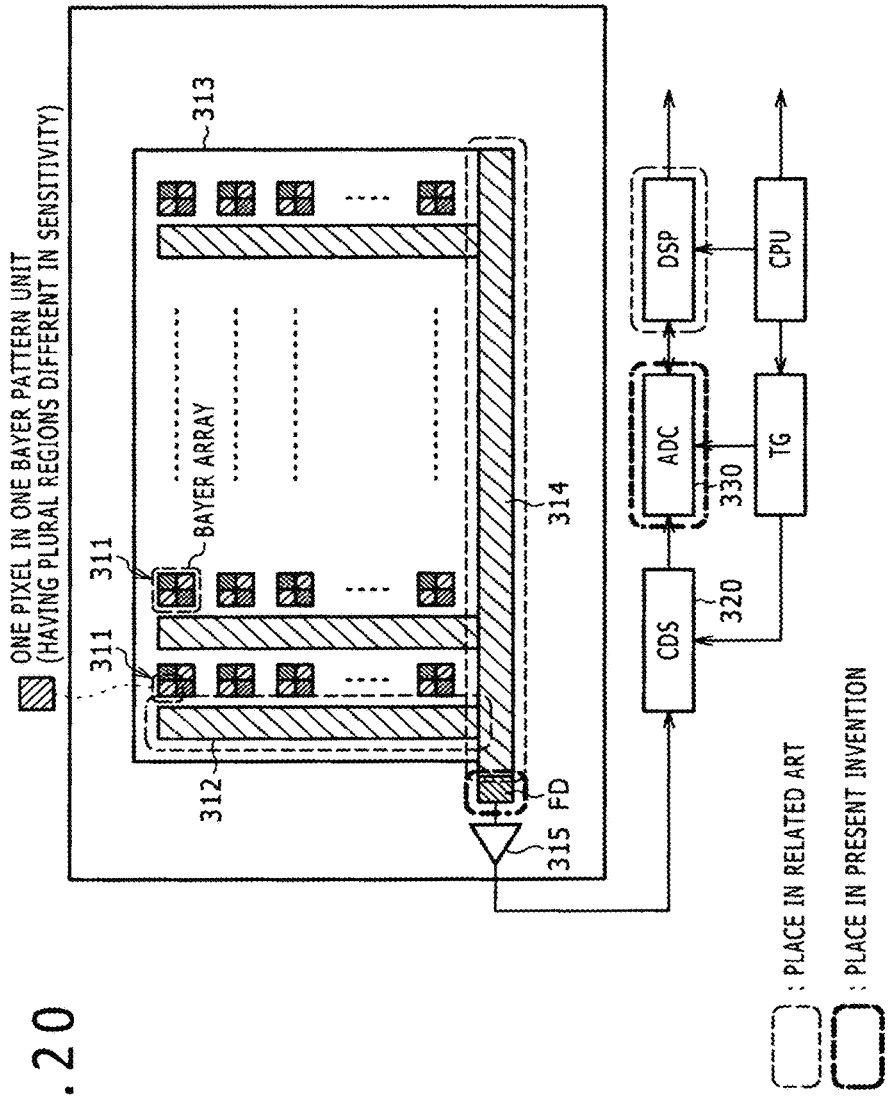

SOLID-STATE IMAGING ELEMENT AND CAMERA SYSTEM

CROSS-REFERENCES TO RELATED APPLICATIONS

This application is a continuation of and claims the benefit under 35 U.S.C. § 120 of U.S. patent application Ser. No. 13/953,194, titled "SOLID-STATE IMAGING ELEMENT AND CAMERA SYSTEM," filed on Jul. 29, 2013, now U.S. Pat. No. 9,621,834, which is a division of and claims the benefit under 35 U.S.C. § 120 of U.S. patent application Ser. No. 12/457,755, titled "SOLID-STATE IMAGING ELEMENT AND CAMERA SYSTEM," filed on Jun. 19, 2009, now U.S. Pat. No. 8,525,906, which claims the benefit under 35 U.S.C. § 119 of Japanese Patent Application JP 2008-187026, filed on Jul. 18, 2008. The entire contents of each of the foregoing applications are hereby incorporated by reference herein in their entireties.

BACKGROUND OF THE INVENTION

1. Field of the Invention

The present invention relates to a solid-state imaging element typified by a CCD and a CMOS image sensor, and a camera system.

2. Description of the Related Art

It is desired to realize a wide dynamic range solid-state imaging element by which even details can be so imaged that high-luminance information does not collapse and low-luminance part of the subject image does not become too black even in photographing against light such as light of car headlights, illumination light of a ball game ground, or sunlight.

Under such circumstances, regarding a solid-state imaging element such as a CCD, techniques for enlarging the dynamic range are disclosed in e.g. Japanese Patent No. 2125710, Japanese Patent Laid-Open No. Hei 3-117281, Japanese Patent Laid-Open No. Hei 9-205589, and Japanese Patent Laid-Open No. 2004-320119 (Hereinafter, Patent Document 1, Patent Document 2, Patent Document 3, and Patent Document 4, respectively).

Patent Document 1 discloses an example to enlarge the dynamic range of a CCD or the like by disposing plural regions (cells) different from each other in the sensitivity characteristic in one pixel of the CCD and allowing the pixel to have a so-called knee characteristic, in which the input-output characteristic changes in a stepwise manner.

The knee characteristic refers to a characteristic curve obtained by setting the slope of the high-input region gentler than that of the low-input region in a curve indicating the relationship between the exposure amount and the output current. The knee characteristic is often employed as a high-luminance signal compression technique.

As a method for changing the sensitivity of the sensitive region (cell), e.g. a method of changing the aperture ratio of the element, a method of providing an optical filter (ND filter), and a method of changing the impurity concentration are disclosed.

According to Patent Document 1, it seems that this technique can be applied also to XY address type imaging elements other than the CCD, although detailed description is not absent therein.

Patent Document 2 discloses an example to achieve such a wide dynamic range as to prevent the collapse of a subject image even under highlighting light such as bulb light. In this example, adjacent pixels or cells different from each other in the photosensitivity characteristic in a photosensitive pixel cell of a CCD are combined as one group, and the signal charges of the respective cells in one pixel are added to each other to thereby obtain the signal charge of the pixel.

In this case, as a scheme for changing the photosensitivity, cells having different pixel areas are combined as one group for example.

In the technique disclosed in Patent Document 3, one pixel of a photosensitive pixel cell in a CCD is divided into two regions different from each other in the sensitivity similarly, and the signal charges of the regions having the different sensitivities in the same pixel are mixed in a vertical register and are vertically transferred. Furthermore, in this technique, the signal charges of the regions having the different sensitivities are sorted into two horizontal transfer gates by a sorting gate. In addition, the signal of the higher sensitivity side is clipped by an external signal processing circuit and then is added to the signal of the lower sensitivity side to thereby form a video signal.

In this case, the characteristic graph of the video signal output with respect to the incident light amount is a polygonal line graph. In this graph, the slope on the higher sensitivity side (lower illuminance side) is steep and the slope on the lower sensitivity side (higher illuminance side) is gradual.

Patent Document 4 discloses a method for addressing a problem that, in an imaging element including a high-sensitivity imaging cell and a low-sensitivity imaging cell, the amount of the data of a RAW image (raw data) is large due to data by both the imaging cells.

Specifically, information on a captured image is analyzed and whether or not the image information of high-luminance part needs to be recorded is automatically determined. If it is determined that the image information of high-luminance part needs to be recorded, the RAW image data of the high-luminance part as well as the information of low-luminance part is recorded. If it is determined that the image information of high-luminance part does not need to be recorded, the information of the high-luminance part is not recorded but only the RAW image data of the low-luminance part is recorded.

One pixel is obtained by combining a main photosensitive pixel cell (it has large area and high sensitivity, and the center part of a microlens is mainly used as it) and a sub photosensitive pixel cell (it has small area and low sensitivity and is disposed on the edge side of the microlens) with each other.

Japanese Patent Laid-Open No. 2005-278135 (Patent Document 5) discloses a CMOS image sensor in which each of column parallel ADCs is composed of a comparator and an up/down counter. This CMOS image sensor can execute addition operation of pixel digital values for plural rows without additional circuits such as an adder and a line memory device.

SUMMARY OF THE INVENTION

However, in the case of the above-described divided-pixel addition, an invalid region (dead space) that does not directly contribute to photo-sensing exists in terms of signal processing differently from a pixel having the area equal to the total of the areas of the divided pixels.

Therefore, the areas of the individual cells resulting from the division are smaller than that when the pixel is simply divided into four areas, and thus the number of saturated electrons is smaller than that when the pixel is simply divided into four areas. Accordingly, shot noise is relatively increased and the S/N of the individual divided pixels is lowered.

Because the shot noise is also added in every divided-pixel addition, the S/N of the result of the divided-pixel addition is also lowered.

Furthermore, the addition processing for pixel signals is analog signal addition and the sensitivity differs on a pixel-by-pixel basis. This causes e.g. a problem that the saturation value varies and the breakpoint position also varies.

Moreover, in the case of digital addition, a memory has to be provided outside the sensor.

Specifically, in the related-art addition methods in which one pixel cell is divided into plural pixel cells having different sensitivities or accumulation times and the sensitivity is measured as the saturated charge amount Qs of the pixel, the saturated charge amount Qs varies on a pixel-by-pixel basis. Thus, the addition result varies from pixel to pixel even when the light amount is the same.

In other words, in the sensitivity curve (polygonal line graph) obtained by plotting the incident light amount on the abscissa and plotting the saturated charge amount Qs on the ordinate, the breakpoint position (ordinate) varies at the point of addition of the divided pixel cells (abscissa).

There is a desire for the present invention to provide a solid-state imaging element and a camera system that can realize divided-pixel addition free from variation in the number of output electrons of a pixel with respect to the incident light amount and are allowed to have such a wide dynamic range that the sensitivity is high when the incident light amount is small and is lowered when the incident light amount is large and the output is not saturated.

According to a first embodiment of the present invention, there is provided a solid-state imaging element including a pixel unit configured to include a plurality of pixels arranged in a matrix, and a pixel signal readout unit configured to include an analog-digital (AD) conversion unit that carries out AD conversion of a pixel signal read out from the pixel unit. Each one of the pixels in the pixel unit includes a plurality of divided pixels arising from division into regions different from each other in optical sensitivity or a charge accumulation amount. The pixel signal readout unit reads out divided-pixel signals of the divided pixels in the pixel. The AD conversion unit carries out AD conversion of the divided-pixel signals that are read out and adds the divided-pixel signals to each other to thereby obtain a pixel signal of one pixel.

According to a second embodiment of the present invention, there is provided a camera system having a solid-state imaging element and an optical system that forms a subject image on the solid-state imaging element. The solid-state imaging element includes a pixel unit configured to include a plurality of pixels arranged in a matrix, and a pixel signal readout unit configured to include an analog-digital (AD) conversion unit that carries out AD conversion of a pixel signal read out from the pixel unit. Each one of the pixels in the pixel unit includes a plurality of divided pixels arising from division into regions different from each other in a charge accumulation amount. The pixel signal readout unit reads out divided-pixel signals of the divided pixels in the pixel. The AD conversion unit carries out AD conversion of the divided-pixel signals that are read out and adds the divided-pixel signals to each other to thereby obtain a pixel signal of one pixel.

According to a third embodiment of the present invention, there is provided a solid-state imaging element including a pixel unit configured to include a plurality of pixels arranged in a matrix, and a pixel signal readout unit configured to include an analog-digital (AD) conversion unit that carries out AD conversion of a pixel signal read out from the pixel unit. Each one of the pixels in the pixel unit includes a plurality of divided pixels arising from division into a plurality of regions. The pixel signal readout unit reads out divided-pixel signals of the divided pixels in the pixel. The AD conversion unit carries out AD conversion of the divided-pixel signals that are read out and adds the divided-pixel signals to each other to thereby obtain a pixel signal of one pixel.

In the embodiments of the present invention, the divided-pixel signals are read out by the pixel signal readout unit from the plurality of divided pixels arising from division into the regions different from each other in the charge accumulation amount.

In the pixel signal readout unit, the respective divided-pixel signals that are read out are subjected to AD conversion and added to each other, so that the pixel signal of one pixel is obtained.

The embodiments of the present invention can realize divided-pixel addition free from variation in the number of output electrons of the pixel with respect to the incident light amount. As a result, it is possible for the solid-state imaging elements and the camera system to have such a wide dynamic range that the sensitivity is high when the incident light amount is small and is lowered when the incident light amount is large and the output is not saturated.

BRIEF DESCRIPTION OF THE DRAWINGS

FIG. 15 is a diagram showing an example in which one pixel under a same-color color filter is divided into four divided pixels different from each other in the photosensitivity or the accumulation time and A/D conversion is carried out with bit accuracies different for each divided pixel;

FIG. 16 is a diagram showing the numbers of bits that can be set for the respective divided pixels when the divided pixels are subjected to A/D conversion with different bit accuracies and the lowest resolution of each pixel is assumed to be 1 bit;

FIG. 20 is a diagram showing a configuration example of a solid-state imaging element corresponding to a CCD sensor according to the embodiment of the present invention.

DETAILED DESCRIPTION OF THE PREFERRED EMBODIMENTS

An embodiment of the present invention will be described below in association with the drawings.

Figure 1:
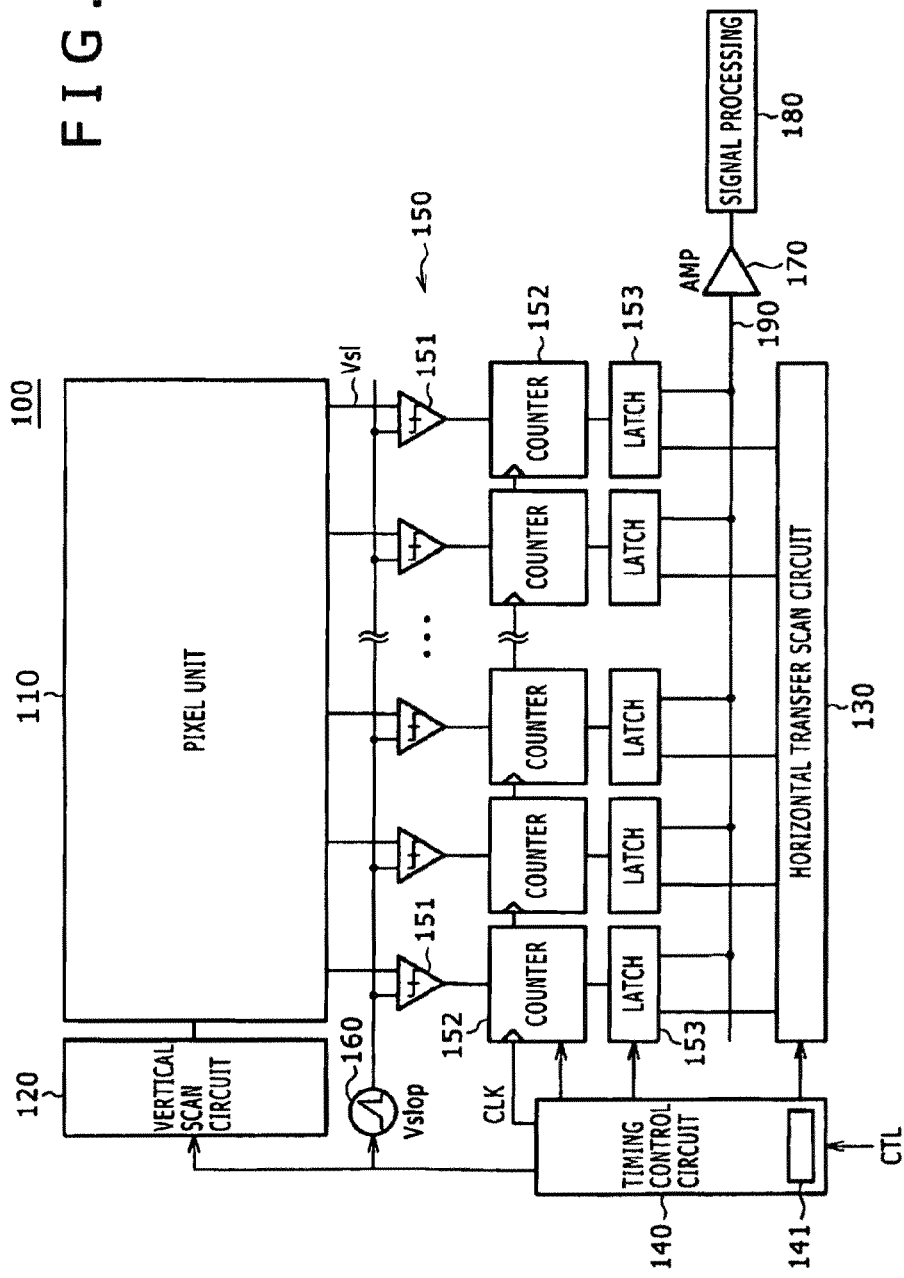
FIG. 1 is a diagram showing a configuration example of a CMOS image sensor (solid-state imaging element) according to an embodiment of the present invention.

FIG. 1 is a block diagram showing a configuration example of a solid-state imaging element (CMOS image sensor) including column parallel ADCs according to the embodiment of the present invention.

The embodiment of the present invention can be applied not only to the CMOS image sensor but also to a CCD. The following description will be made by taking the CMOS image sensor as one example.

As shown in FIG. 1, this solid-state imaging element 100 has a pixel unit 110, a vertical scan circuit 120, a horizontal transfer scan circuit 130, a timing control circuit 140, and an analog-digital converter (ADC) group 150.

The solid-state imaging element 100 further has a digital-analog converter (DAC) 160, amplifier circuits (S/A) 170, a signal processing circuit 180, and a horizontal transfer line 190.

The pixel signal readout unit is formed by the vertical scan circuit 120, the horizontal transfer scan circuit 130, the timing control circuit 140, the ADC group 150, and the DAC 160.

The pixel unit 110 is formed by arranging plural pixels in a matrix (on rows and columns).

Figure 2:
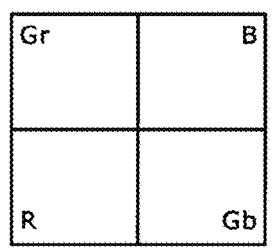
FIG. 2 is a diagram showing a Bayer array as a pixel array example.

As the pixel array in the pixel unit 110, e.g. the Bayer array like that shown in FIG. 2 is employed.

In the pixel unit 110 of the present embodiment, one pixel is divided into plural divided pixel cells DPC each including a photoelectric conversion element formed of e.g. a photodiode.

Specifically, in the solid-state imaging element (CMOS image sensor) 100 including the column parallel ADCs, one pixel under a same-color color filter of the Bayer array is divided into plural divided pixel cells DPC different from each other in the sensitivity or the accumulation time.

Furthermore, in AD conversion of a pixel signal and output thereof in the column direction, divided-pixel signals output from the divided pixels are added to each other and subjected to AD conversion. At this time, the range of the input to the AD converter is so clipped as to be equal to or lower than the saturated output voltages of the respective pixels so that the output value of each pixel may be invariably a certain digital value.

The following description will deal with an example in which one pixel is divided into four divided pixel cells DPC-A to DPC-D.

Figure 3:
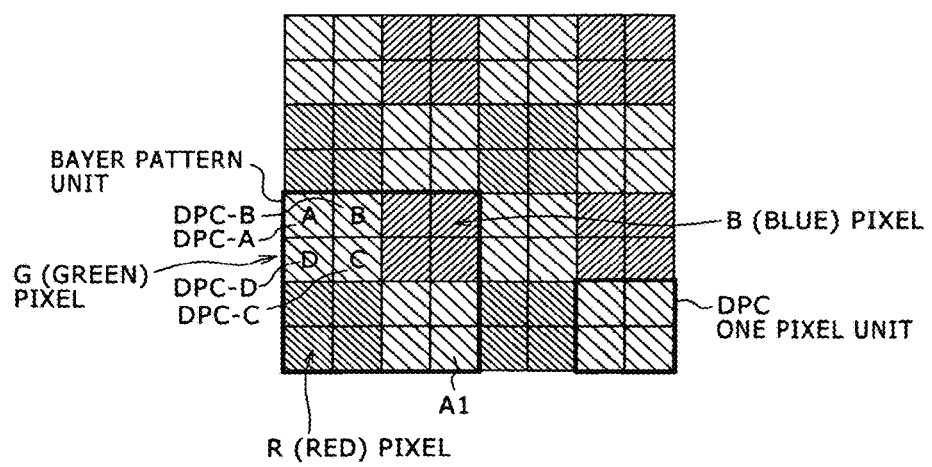
FIG. 3 is a conceptual diagram of pixel division according to the present embodiment.

FIG. 3 is a conceptual diagram of the pixel division according to the embodiment of the present invention.

FIG. 3 shows a division method in the case of the Bayer array. In this example, one pixel under a same-color filter is divided into four cells, and the individual pixels resulting from the division are different from each other in the sensitivity or the accumulation time.

In FIG. 3, a green (G) pixel PCG is divided into four pixels DPC-A, DPC-B, DPC-C, and DPC-D.

The details of the configurations of the pixel and the divided pixels, the division form, and so on in this pixel unit 110 will be described later.

The solid-state imaging element 100 of the present embodiment time-sequentially sends e.g. divided-pixel signals amplified in a pixel to a vertical signal line, and carries out AD conversion by an AD converter (AD conversion unit) in the ADC group 150 disposed in the column pixel signal readout unit.

In the subsequent AD conversion operation for the second divided-pixel signal, the solid-state imaging element 100 adds the first AD conversion value and carries out the AD conversion operation for the second divided-pixel signal.

In the subsequent AD conversion operation for the third divided-pixel signal, the solid-state imaging element 100 adds the second AD conversion value and carries out the AD conversion operation for the third divided-pixel signal.

In the subsequent AD conversion operation for the fourth divided-pixel signal, the solid-state imaging element 100 adds the third AD conversion value and carries out the AD conversion operation for the fourth divided-pixel signal.

The solid-state imaging element of the present embodiment employs a divided-pixel addition method in which pixel signals of plural divide pixels are sequentially added by the AD converter provided in the column unit by such a method.

In the solid-state imaging element 100, the timing control circuit 140 that generates an internal clock, the vertical scan circuit 120 that controls row addresses and row scanning, and the horizontal transfer scan circuit 130 that controls column addresses and column scanning are disposed as control circuitry for sequentially reading out signals of the pixel unit 110.

The ADC group 150 has comparators 151 that each compare a reference voltage Vslop having a ramp waveform arising from stepwise change in a reference voltage generated by the DAC 160 with an analog signal (potential Vsl) obtained from a pixel via the vertical signal line on a row-by-row basis.

In the ADC group 150, ADCs each composed of an up/down counter (hereinafter, referred to simply as the counter) 152 that counts the comparison time and a latch 153 that holds the count result are arranged on plural columns.

The ADC has an n-bit digital signal conversion function and is disposed for each vertical signal line (column line), so that a column parallel ADC block is formed.

The output of each latch 153 is connected to the horizontal transfer line 190 having e.g. a 2n-bit width.

Furthermore, 2n amplifier circuits 170 corresponding to the horizontal transfer line 190 and the signal processing circuit 180 are disposed.

In the ADC group 150, the analog signal (potential Vsl) read out to the vertical signal line is compared with the reference voltage Vslop (with a slope waveform that has a certain slope and linearly changes) by the comparator 151 disposed on a column-by-column basis.

At this time, the counter 152 disposed on a column-by-column basis as with the comparator 151 operates, and the potential (analog signal) Vsl of the vertical signal line is converted to a digital signal through change in the potential Vslop of the ramp waveform and the counter value with the one-to-one correspondence therebetween.

The change in the reference voltage Vslop is to convert voltage change to time change, and the ADC counts the time with a certain cycle (clock) to thereby convert the time change to a digital value.

Upon the intersection of the analog electrical signal Vsl with the reference voltage Vslop, the output of the comparator 151 is inverted, and the input clock to the counter 152 is stopped or the clock whose input has been stopped so far is input to the counter 152, so that one AD conversion is completed.

For example, the divided-pixel addition carried out by the above-described AD converter is realized by continuously executing this up/down count processing of the counter the same number of times as the number of divided-pixel signals without resetting the counter.

Figure 4:
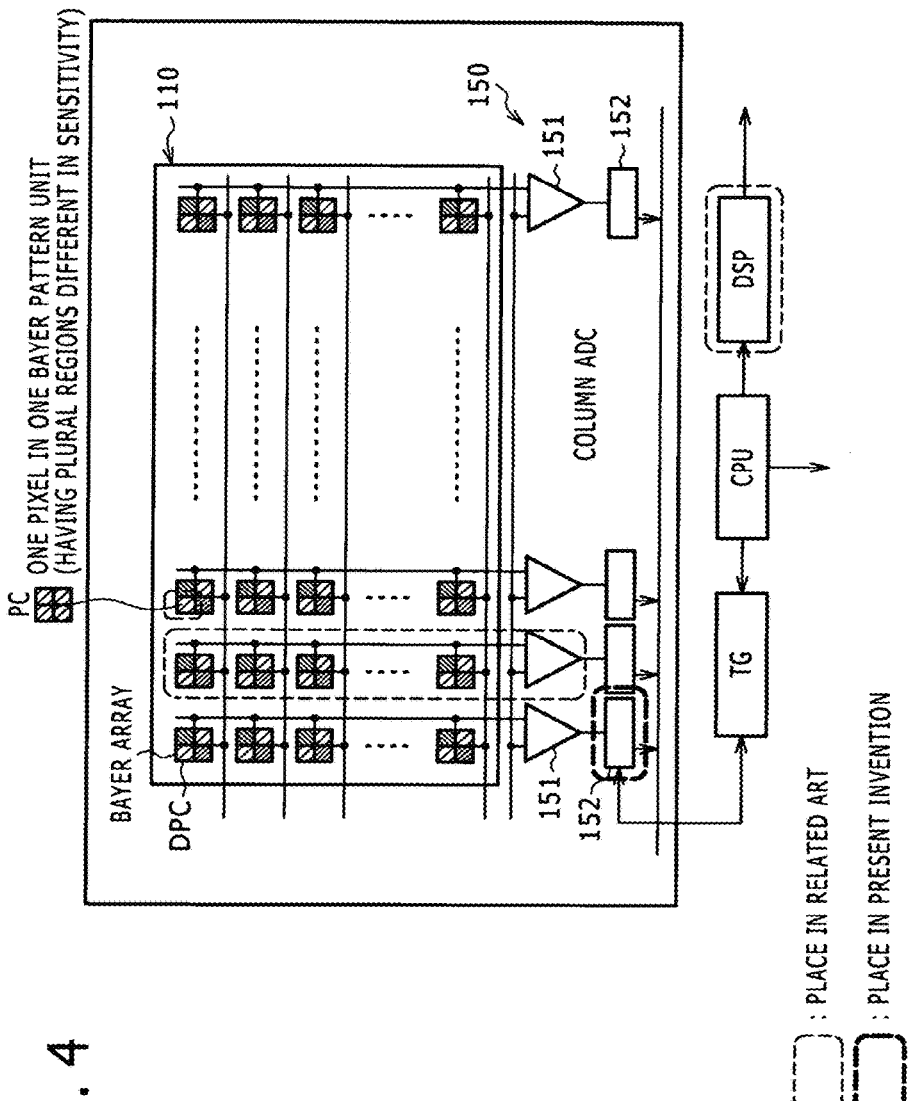
FIG. 4 is a diagram showing the place at which addition processing is executed in the solid-state imaging element (CMOS image sensor) including column parallel ADCs of FIG. 1.

FIG. 4 is a diagram showing the place at which the addition processing is executed in the solid-state imaging element (CMOS image sensor) including the column parallel ADCs of FIG. 1.

In FIG. 4, the areas surrounded by dashed lines are the places at which the addition processing can be actually executed. The thin dashed line indicates the place in related arts, and the heavy dashed line indicates the area relating to the embodiment of the present invention.

In previously-known methods of the signal addition processing for divided pixels, the addition processing is executed by a signal processor such as a DSP.

In contrast, in the present embodiment, at the time of AD conversion, the counter 152 sequentially executes the addition processing while executing the AD conversion of four divided-pixel signals as described above.

Specifically, divided-pixel signals amplified in a pixel are time-sequentially sent to the vertical signal line, and the AD conversion is carried out by the AD converter (AD conversion unit) in the ADC group 150 disposed in the column pixel signal readout unit.

In the subsequent AD conversion operation for the second divided-pixel signal, each ADC in the ADC group 150 adds the first AD conversion value and carries out the AD conversion operation for the second divided-pixel signal.

In the subsequent AD conversion operation for the third divided-pixel signal, each ADC in the ADC group 150 adds the second AD conversion value and carries out the AD conversion operation for the third divided-pixel signal.

In the subsequent AD conversion operation for the fourth divided-pixel signal, each ADC in the ADC group 150 adds the third AD conversion value and carries out the AD conversion operation for the fourth divided-pixel signal.

After the end of the above-described AD conversion period, the data held in the latches 153 are transferred to the horizontal transfer line 190 and input to the signal processing circuit 180 via the amplifiers 170 by the horizontal transfer scan circuit 130, so that a two-dimensional image is created through predetermined signal processing.

This is the end of the description of the basic configuration and functions of the embodiment of the present embodiment.

A detailed description will be made below about the configurations of the pixel and the divided pixels, the division form, the divided-pixel addition processing, and so on as characteristic configurations of the present embodiment.

First, one example of the configuration of a basic divided pixel in a CMOS image sensor will be described below in order to facilitate understanding.

Figure 5:
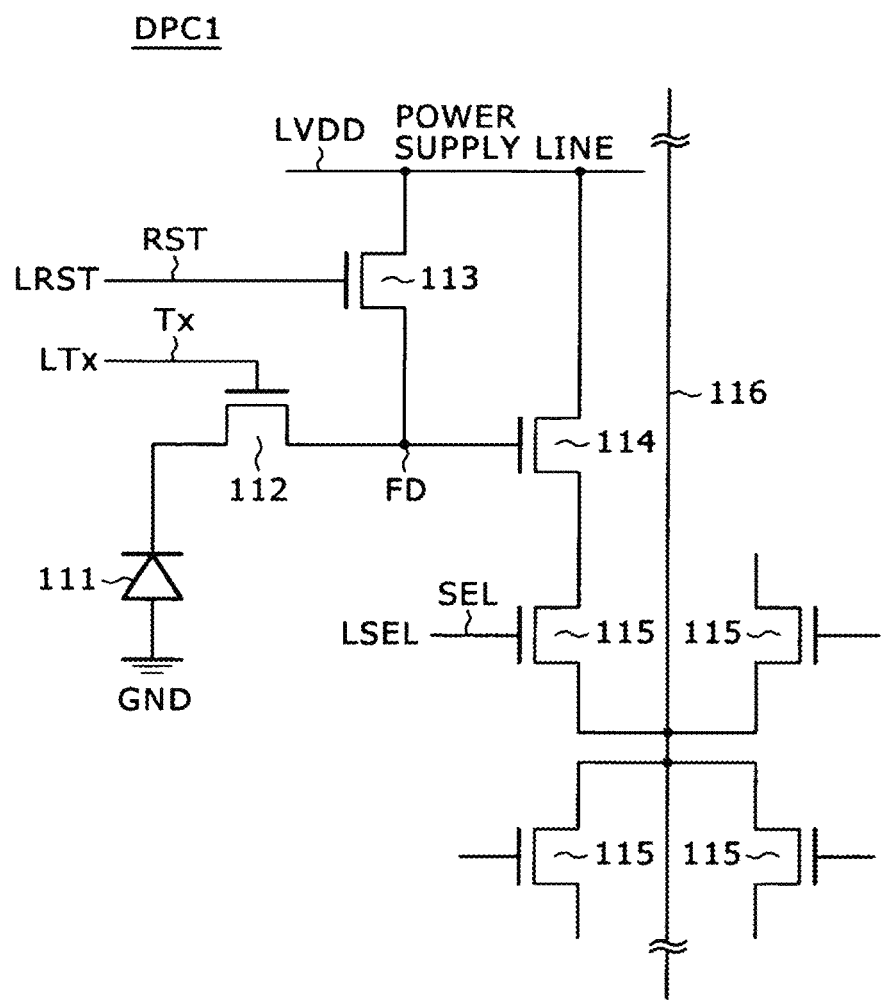
FIG. 5 is a diagram showing one example of a divided pixel including four transistors, in the CMOS image sensor according to the present embodiment.

FIG. 5 is a diagram showing one example of a divided pixel including four transistors, in the CMOS image sensor according to the present embodiment.

This divided pixel DPC1 has a photoelectric conversion element 111 formed of e.g. a photodiode.

The divided pixel DPC of FIG. 4 has the following four transistors as active elements for this one photoelectric conversion element 111: a transfer transistor 112, a reset transistor 113, an amplification transistor 114 as the amplifier, and a selection transistor 115.

The photoelectric conversion element 111 carries out photoelectric conversion of incident light to a charge (electrons, in this example) with the amount dependent on the light amount.

The transfer transistor 112 is connected between the photoelectric conversion element 111 and a floating diffusion part FD, and a control signal Tx is given to the gate (transfer gate) thereof via a transfer control line LTx.

This transfers the electrons arising from the photoelectric conversion by the photoelectric conversion element 111 to the floating diffusion part FD.

The reset transistor 113 is connected between a power supply line LVDD and the floating diffusion part FD, and a control signal RST is given to the gate thereof via a reset control line LRST.

This resets the potential of the floating diffusion part FD to the potential of the power supply line LVDD.

The gate of the amplification transistor 114 is connected to the floating diffusion part FD. The amplification transistor 114 is connected to a vertical signal line 116 via the selection transistor 115 and forms a source follower with a constant current source outside the pixel unit.

A control signal (address signal or select signal) SEL is given to the gate of the selection transistor 115 via a selection control line LSEL, and the selection transistor 115 is turned on.

Upon the turning-on of the selection transistor 115, the amplification transistor 114 amplifies the potential of the floating diffusion part FD and outputs the voltage dependent on this potential to the vertical signal line 116. The voltages output from the respective pixels via the vertical signal lines 116 are output to the ADC group 150 as a pixel signal readout circuit.

These operations are carried out in the respective divided pixels DPC on one row simultaneously, because the respective gates of e.g. the transfer transistor 112, the reset transistor 113, and the selection transistor 115 are connected on a row-by-row basis.

The reset control line LRST, the transfer control line LTx, and the selection control line LSEL, which are disposed in the pixel unit 110, are disposed as one group for each of the rows of the pixel array.

The reset control line LRST, the transfer control line LTx, and the selection control line LSEL are driven by a pixel drive circuit 102.

It is also possible to directly apply the above-described configuration to the divided pixel cell according to the present embodiment.

Furthermore, it is also possible to employ a configuration in which the floating diffusion part FD is shared by divided pixel cells as a configuration in which the photoelectric conversion element and the transfer transistor are included in each of the divided pixel cells.

In this case, it is also possible that the divided pixel cells are so formed as to share the amplification transistor as the amplifier, the selection transistor, and the reset transistor.

Figure 6:
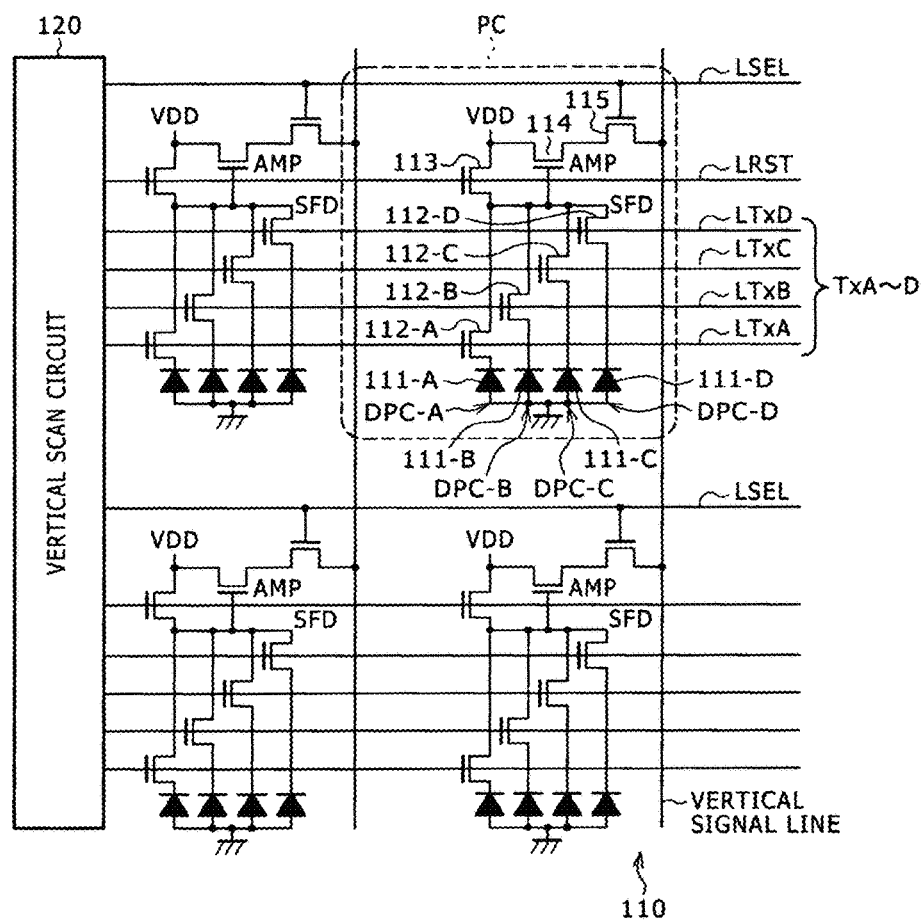
FIG. 6 is a circuit diagram showing an example of a pixel in which plural divided pixels share a floating diffusion part, an amplification transistor, a selection transistor, and a reset transistor.

FIG. 6 is a circuit diagram showing an example of a pixel in which plural divided pixels share the floating diffusion part, the amplification transistor, the selection transistor, and the reset transistor.

In a pixel PC including plural divided pixels DPC-A to DPC-D in FIG. 6, photoelectric conversion elements 111-A to 111-D and transfer transistors 112-A to 112-D are disposed for the divided pixels DPC-A to DPC-D, respectively.

One end (e.g. the drain) of each of the transfer transistors 112-A to 112-D is connected to a shared floating diffusion part SFD.

The gate of the transfer transistor 112-A is connected to a transfer control line LTxA, and the gate of the transfer transistor 112-B is connected to a transfer control line LTxB. Similarly, the gate of the transfer transistor 112-C is connected to a transfer control line LTxC, and the gate of the transfer transistor 112-D is connected to a transfer control line LTxD.

The reset transistor 113 is connected between a supply potential VDD and the shared floating diffusion part SFD. The gate of the reset transistor 113 is connected to the reset control line LRST.

The amplification transistor 114 and the selection transistor 115 are connected in series between the supply potential VDD and the vertical signal line 116. The gate of the amplification transistor 114 is connected to the shared floating diffusion part SFD, and the gate of the selection transistor 115 is connected to the selection control line LSEL.

In this configuration, divided-pixel signals arising from photoelectric conversion by the photoelectric conversion elements 111-A to 111-D in the divided pixels DPC-A to DPC-D are transferred to the amplification transistor 114 as the amplifier via the shared floating diffusion part SFD. The divided-pixel signals are amplified and the amplified divided-pixel signals are time-sequentially sent to the vertical signal line 116.

Furthermore, it is also possible to employ a configuration in which the photoelectric conversion element, the transfer transistor, and the reset transistor are included in each of divided pixel cells and the floating diffusion part FD is also individually possessed by the divided pixel cell.

In this case, it is also possible that the divided pixel cells are so formed as to share the amplification transistor as the amplifier.

Figure 7:
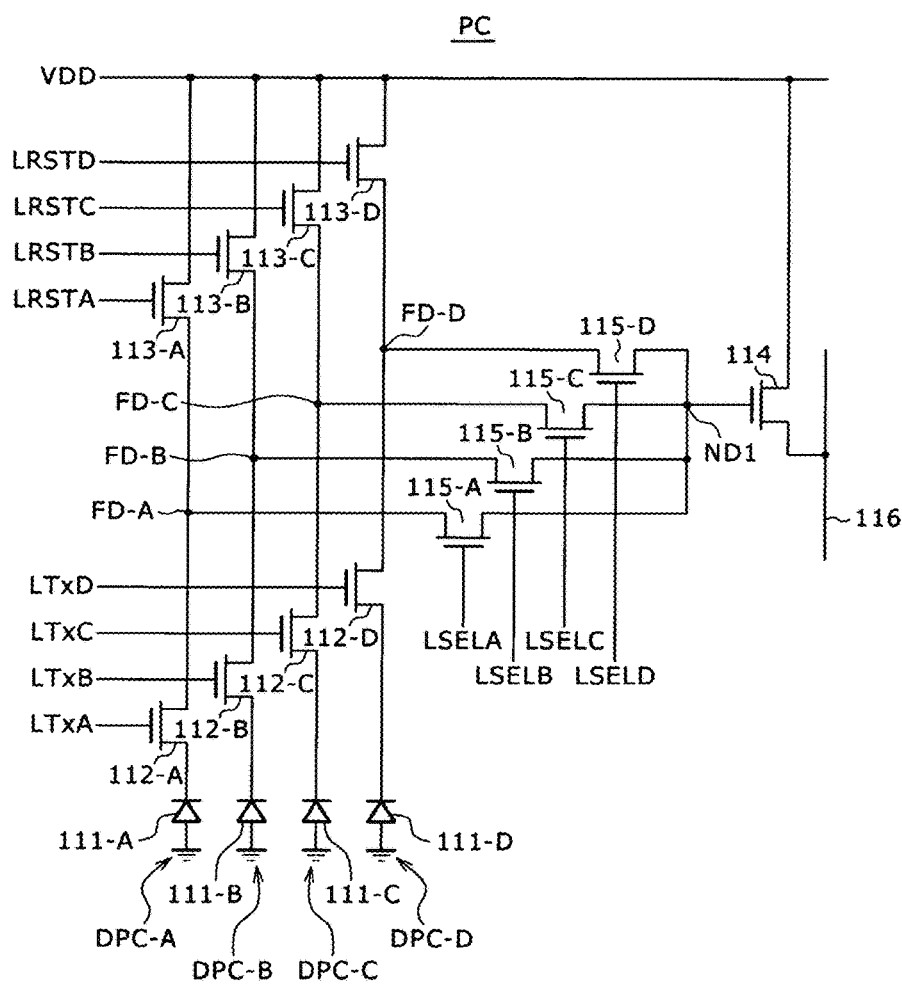
FIG. 7 is a circuit diagram showing an example of a pixel in which plural divided pixels each individually have the floating diffusion part and share the amplification transistor.

FIG. 7 is a circuit diagram showing an example of a pixel in which plural divided pixels each individually have the floating diffusion part and share the amplification transistor.

In a pixel PC including plural divided pixels DPC-A to DPC-D in FIG. 7, the photoelectric conversion elements 111-A to 111-D and the transfer transistors 112-A to 112-D are disposed for the divided pixels DPC-A to DPC-D, respectively. Furthermore, floating diffusion parts FD-A to FD-D and reset transistors 113-A to 113-D are disposed in the divided pixels DPC-A to DPC-D, respectively.

A selection transistor 115-A is connected between the floating diffusion part FD-A and a node ND1, and a selection transistor 115-B is connected between the floating diffusion part FD-B and the node ND1.

Similarly, a selection transistor 115-C is connected between the floating diffusion part FD-C and the node ND1, and a selection transistor 115-D is connected between the floating diffusion part FD-D and the node ND1.

The gate of the transfer transistor 112-A is connected to the transfer control line LTxA, and the gate of the transfer transistor 112-B is connected to the transfer control line LTxB. Similarly, the gate of the transfer transistor 112-C is connected to the transfer control line LTxC, and the gate of the transfer transistor 112-D is connected to the transfer control line LTxD.

The gate of the reset transistor 113-A is connected to a reset control line LRSTA, and the gate of the reset transistor 113-B is connected to a reset control line LRSTB. Similarly, the gate of the reset transistor 113-C is connected to a reset control line LRSTC, and the gate of the reset transistor 113-D is connected to a reset control line LRSTD.

The gate of the selection transistor 115-A is connected to a selection control line LSELA, and the gate of the selection transistor 115-B is connected to a selection control line LSELB. Similarly, the gate of the selection transistor 115-C is connected to a selection control line LSELC, and the gate of the selection transistor 115-D is connected to a selection control line LSELD.

The amplification transistor 114 is connected between the supply potential VDD and the vertical signal line 116. The gate of the amplification transistor 114 is connected to the node ND1.

In this configuration, divided-pixel signals arising from photoelectric conversion by the photoelectric conversion elements 111-A to 111-D in the divided pixels DPC-A to DPC-D are transferred to the floating diffusion parts FD-A to FD-D. Through the floating diffusion parts FD-A to FD-D, the divided-pixel signals are further transferred to the amplification transistor 114 as the amplifier via the selection transistors 115-A to 115-D. The divided-pixel signals are amplified and the amplified divided-pixel signals are time-sequentially sent to the vertical signal line 116.

Furthermore, it is also possible to employ a configuration in which plural divided pixels of one pixel are separated into plural groups and the floating diffusion part FD is shared on a group-by-group basis.

In this case, it is also possible that the reset transistor and the selection transistor are shared in each separation group and the amplification transistor is shared by all the divided pixels.

Figure 8:
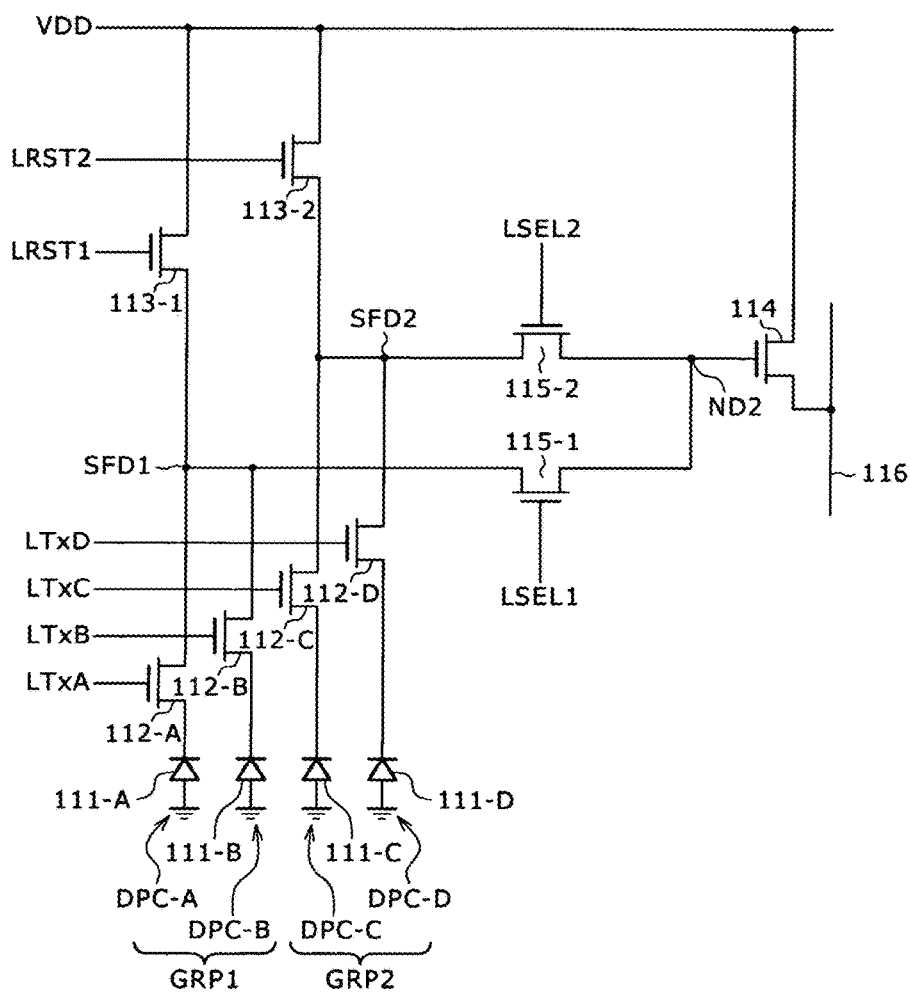
FIG. 8 is a circuit diagram showing an example of a pixel in which plural divided pixels are separated into groups, and the floating diffusion part is shared in each group and the amplification transistor is shared by all the divided pixels.

FIG. 8 is a circuit diagram showing an example of a pixel in which plural divided pixels are separated into groups, and the floating diffusion part is shared in each group and the amplification transistor is shared by all the divided pixels.

In this example, four divided pixels DPC-A, DPC-B, DPC-C, and DPC-D are separated into two groups.

Specifically, the divided pixel DPC-A and the divided pixel DPC-B are separated into a first group GRP1, and the divided pixel DPC-C and the divided pixel DPC-D are separated into a second group GRP2.

In the divided pixels DPC-A and DPC-B in the first group GRP1 in FIG. 8, the photoelectric conversion elements 111-A and 111-B and the transfer transistors 112-A and 112-B are disposed.

One end (e.g. the drain) of each of the transfer transistors 112-A and 112-B is connected to a shared floating diffusion part SFD1.

The gate of the transfer transistor 112-A is connected to the transfer control line LTxA, and the gate of the transfer transistor 112-B is connected to the transfer control line LTxB.

In the divided pixels DPC-C and DPC-D in the second group GRP2 in FIG. 8, the photoelectric conversion elements 111-C and 111-D and the transfer transistors 112-C and 112-D are disposed.

One end (e.g. the drain) of each of the transfer transistors 112-C and 112-D is connected to a shared floating diffusion part SFD2.

The gate of the transfer transistor 112-C is connected to the transfer control line LTxC, and the gate of the transfer transistor 112-D is connected to the transfer control line LTxD.

A reset transistor 113-1 is connected between the supply potential VDD and the shared floating diffusion part SFD1. The gate of the reset transistor 113-1 is connected to a reset control line LRST1.

A reset transistor 113-2 is connected between the supply potential VDD and the shared floating diffusion part SFD2. The gate of the reset transistor 113-2 is connected to a reset control line LRST2.

A selection transistor 115-1 is connected between the shared floating diffusion part SFD1 and a node ND2, and a selection transistor 115-2 is connected between the shared floating diffusion part SFD2 and the node ND2.

The gate of the selection transistor 115-1 is connected to a selection control line LSEL1, and the gate of the selection transistor 115-2 is connected to a selection control line LSEL2.

The amplification transistor 114 is connected between the supply potential VDD and the vertical signal line 116. The gate of the amplification transistor 114 is connected to the node ND2.

In this configuration, divided-pixel signals arising from photoelectric conversion by the photoelectric conversion elements 111-A to 111-D in the divided pixels DPC-A to DPC-D are transferred to the shared floating diffusion parts SFD1 and SFD2. Through the shared floating diffusion parts SFD1 and SFD2, the divided-pixel signals are further transferred to the amplification transistor 114 as the amplifier via the selection transistors 115-1 and 115-2. The divided-pixel signals are amplified and the amplified divided-pixel signals are time-sequentially sent to the vertical signal line 116.

As described above, various ways are available as the scheme of the division into plural regions in the plane of one pixel. These ways are roughly categorized into a shared floating diffusion (shared by four pixels) system (hereinafter, referred to as the shared FD system) and an individual floating diffusion system (hereinafter, referred to as the individual FD system).

FIGS. 9A to 9D are diagrams for explaining the methods of the division into plural regions in the plane of one pixel.

Figure 9A:
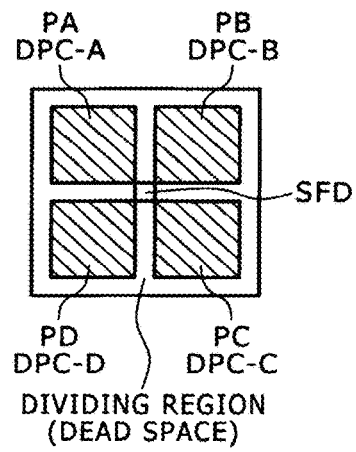
FIGS. 9A to 9D are diagrams for explaining methods of division into plural regions in the plane of one pixel.
Figure 9B:
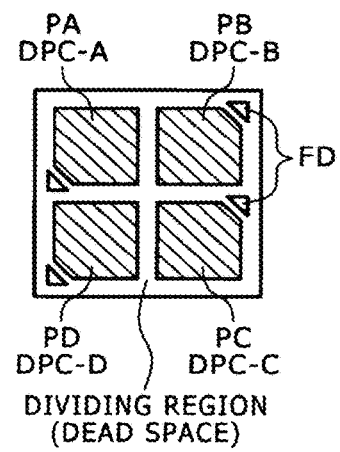
Figure 9C:
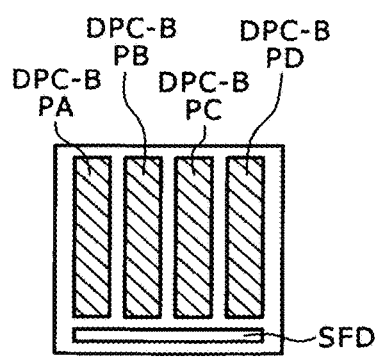
Figure 9D:
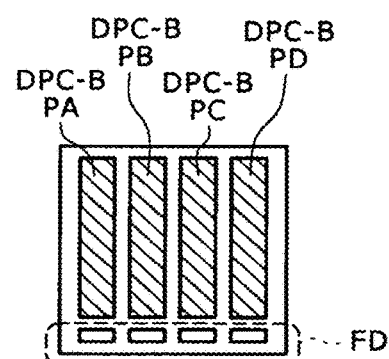

FIG. 9A shows an example of division into four square shapes in the shared FD system. FIG. 9B shows an example of division into four square shapes in the individual FD system. FIG. 9C shows an example of division into four strip shapes in the shared FD system. FIG. 9D shows an example of division into four strip shapes in the individual FD system.

Stacking photosensitive layers and semiconductor layers (PN junction) having different sensitivities in the direction perpendicular to the plane can also be referred to as the pixel division in a broad sense, although detailed description thereof is omitted.

Changing the sensitivity of the divided pixel can be realized by the following methods: changing the aperture ratio of the element; allowing the insulating film over the photosensitive region to have an optical filter characteristic; and changing the impurity concentration in the substrate.

FIGS. 9A to 9D show examples of division of one pixel into four parts, specifically. In these examples, in addition to divided photosensitive regions PA, PB, PC, and PD, an invalid region (dead space) IVL that does not directly contribute to photo-sensing exists.

This region IVL is a space (channel stop) for electrically isolating the divided cells from each other so that the pixel charges accumulated in the divided cells may be prevented from leaking out and interfering with each other. An interconnect for signal processing is provided in this region IVL according to need.

The pixel division will be described below in further detail.

Figure 10:
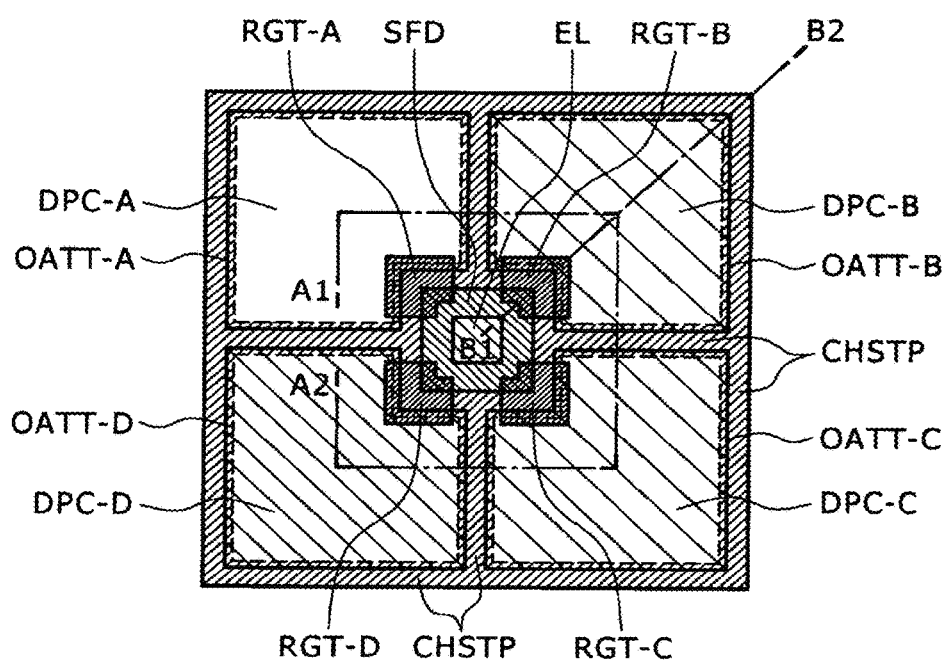
FIG. 10 is a diagram showing a specific example of square pixel division to which a shared FD system according to the embodiment of the present invention is applied.

FIG. 10 is a diagram showing a specific example of square pixel division to which the shared FD system according to the embodiment of the present invention is applied.

Figure 11A:
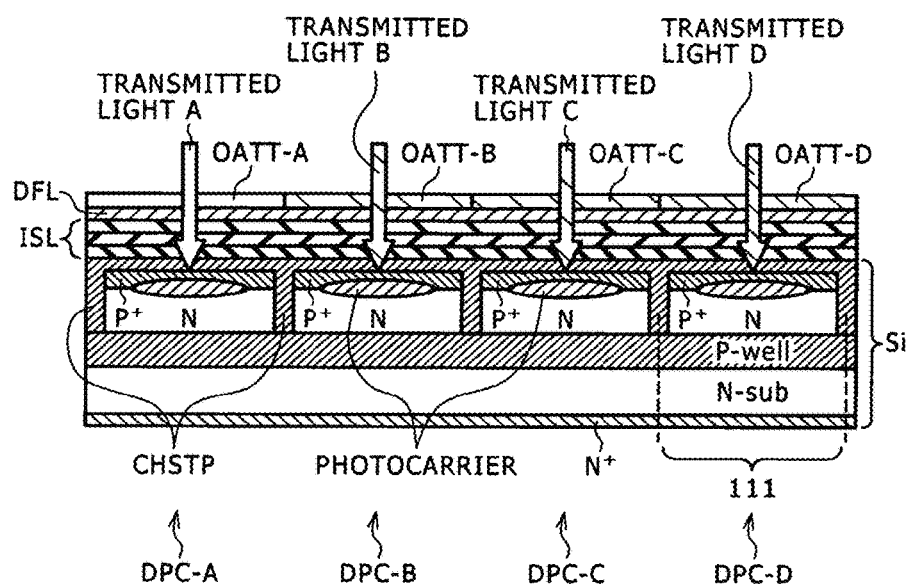
FIGS. 11A and 11B are sectional views perpendicular to FIG. 10.
Figure 11B:
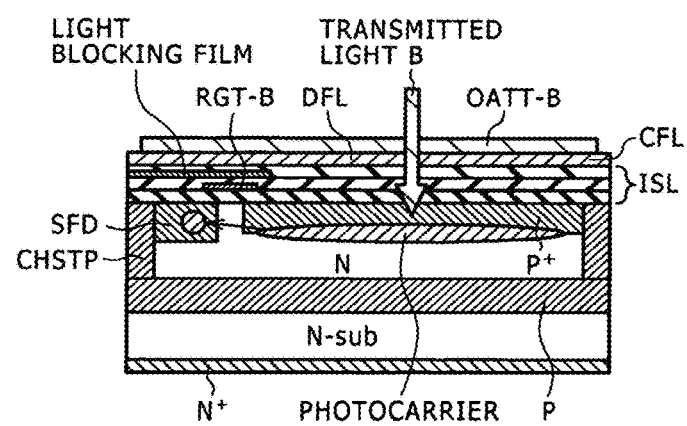

FIGS. 11A and 11B are sectional views perpendicular to FIG. 10. FIG. 11A is a sectional view along line A1-A2 in FIG. 10, and FIG. 11B is a sectional view along line B1-B2 in FIG. 10.

FIG. 10 is a plan view showing a pixel PC corresponding to the above-described pixel division for one pixel in one Bayer pattern unit in a CMOS image sensor with the Bayer array. This pixel PC is an application example of the square division with the shared FD shown in FIG. 9A.

In the shared FD system shown in FIG. 10, it is also possible to carry out signal mixing (substantially transfer and addition) in the floating diffusion part FD.

In the present embodiment, the timings of the signal readout of the individual divided pixels DPC-A to DPC-D are made different from each other to thereby time-sequentially read out signals to the shared floating diffusion part SFD, and signal addition is carried out at the time of AD conversion.

In FIG. 10 and FIG. 11, four photoelectric conversion and charge accumulation regions having different photosensitivities, i.e. the divided pixels DPC-A, DPC-B, DPC-C, and DPC-D, are so disposed as to surround the source.

A color filter CFL of the same color is disposed on the respective pixel regions with the intermediary of an insulating layer ISL and an electrode interconnect layer.

Optical attenuation films OATT-A, OATT-B, OATT-C, and OATT-D different from each other in the photosensitivity or the degree of light blocking are disposed on the color filter CLF. For example, light blocking films having different transmittances are disposed on the respective regions of the divided pixels DPC-A, DPC-B, DPC-C, and DPC-D in order to make the photosensitivities different from each other, and the photosensitivities are so set as to satisfy the relationship DPC-A>DPC-B>DPC-C>DPC-D. Note that the optical attenuation film (e.g. the light blocking film) does not have to be disposed for the divided pixel. DPC-A, which has the highest photosensitivity.

Furthermore, as shown in FIG. 10 and FIGS. 11A and 11B, the individual divided pixel regions are isolated from each other by a channel stop (of the P-type, in this example) CHSTP so that a charge may be accumulated in each cell.

The color filter CFL of the same color is disposed over the silicon substrate with the intermediary of the insulating layer, and thereon the light blocking films having different optical transmittances are disposed above the respective pixel regions.

FIG. 11A schematically shows how charges are generated in the single-crystal silicon cells due to photoelectric conversion depending on the characteristics of the optical attenuation films. In this example, the charge amount is the largest in the leftmost cell and the smallest in the rightmost cell.

FIG. 11B shows how the charge generated in the cell is read out to the shared floating diffusion part SFD when a signal voltage is applied to a readout gate electrode RGT.

In FIG. 10 and FIGS. 11A and 11B, FDEL denotes the FD electrode of the shared floating diffusion part SFD, RGT-A to RGT-D denote readout gate electrodes, and CHSTP denotes the channel stop.

In the semiconductor cells of the individual divided regions, photoelectric conversion dependent on the incident light amount is carried out. Furthermore, an electrical signal dependent on the amount of generated charge is read out to the outside of the pixel via the FD region, which is disposed at the center in the diagrams, in response to a gate readout signal.

In this example, the divided pixels DPC-A, DPC-B, DPC-C, and DPC-D are in decreasing order of signal amount in accordance with the light blocking characteristics.

Figure 12:
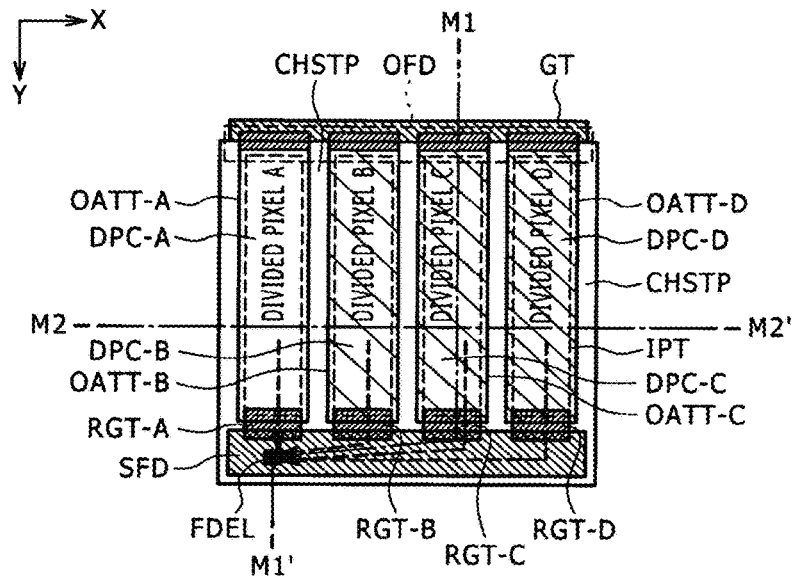
FIG. 12 is a diagram showing a specific example of square pixel division to which pixel division into strips with a shared FD according to the embodiment of the present invention is applied.

FIG. 12 is a diagram showing a specific example of square pixel division to which pixel division into strips with a shared FD according to the embodiment of the present invention is applied.

In FIG. 12, components and functional parts similar to those in FIG. 10 and FIGS. 11A and 11B are indicated by the same symbols for easy understanding.

FIG. 12 is a plan view showing a pixel corresponding to pixel division for one pixel in one Bayer pattern unit in a CMOS image sensor with the Bayer array, as with FIG. 10. In this pixel, the shared FD system is employed and divided pixel regions are disposed in a strip manner.

The optical attenuation films OATT-A, OATT-B, OATT-C, and OATT-D having different transmittances are disposed above the respective pixel regions. The optical attenuation films OATT-A, OATT-B, OATT-C, and OATT-D are disposed above the divided pixels DPC-A, DPC-B, DPC-C, and DPC-D, respectively. Furthermore, the optical sensitivities are so set as to satisfy the relationship DPC-A>DPC-B>DPC-C>DPC-D.

Photocarriers generated in the respective divided pixel regions by photoelectric conversion are read out to the shared floating diffusion part SFD due to the operation of the readout gate electrodes RGT-A, RGT-B, RGT-C, and RGT-D disposed in the respective pixel regions.

In this example, the position of the FD electrode FDEL disposed in the shared floating diffusion part SFD is changed. Specifically, for example, it is disposed in the shared floating diffusion part SFD directly beneath the leftmost divided pixel DPC-A as shown in the diagram. Due to this structure, the position of the signal extraction is closest to the divided pixel DPC-A and remotest from the divided pixel DPC-D.

If the electrical resistance of the diffusion region in the shared floating diffusion part SFD is utilized, electrical attenuation effect (attenuator) is added to the optical attenuation operation because the magnitude of the electrical signal changes depending on the distance from the pixel region.

That is, the flexibility in change in the slope of the sensitivity characteristic is enhanced.

Figure 13:
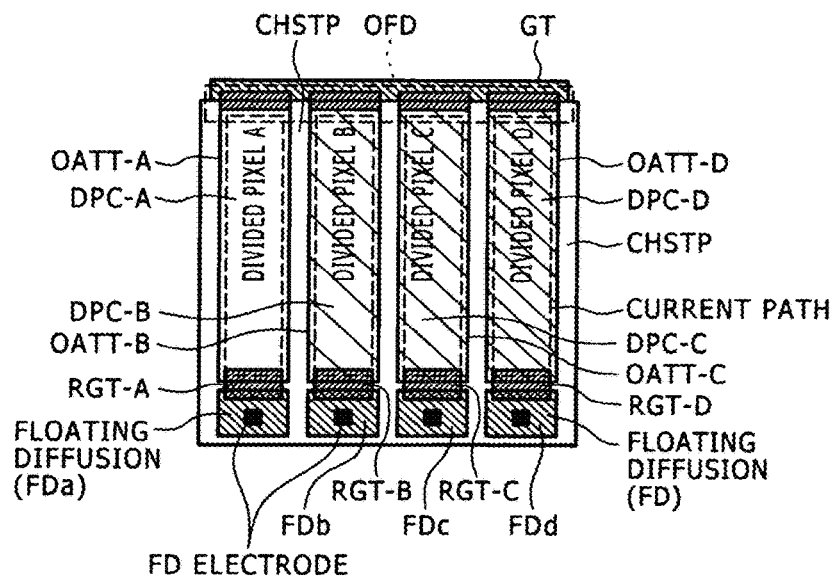
FIG. 13 is a diagram showing a specific example of square pixel division to which pixel division into strips with individual FDs according to the embodiment of the present invention is applied.

FIG. 13 is a diagram showing a specific example of square pixel division to which pixel division into strips with individual FDs according to the embodiment of the present invention is applied.

The example of FIG. 13 is substantially the same as that of FIG. 12 in terms of the structure relating to the optical sensitivity, but is different in the following point.

Specifically, the example of FIG. 13 is different from that of FIG. 12 in that, in the example of FIG. 13, floating diffusion parts FDa, FDb, FDc, and FDd are disposed for the divided pixels DPC-A, DPC-B, DPC-C, and DPC-D, respectively.

In the present embodiment, in the solid-state imaging element (CMOS image sensor) 100 including the column parallel ADCs, one pixel under the same-color color filter of the Bayer array is divided into plural divided pixel cells DPC different from each other in the sensitivity or the accumulation time.

Furthermore, in AD conversion of a pixel signal and output thereof in the column direction, divided-pixel signals output from the divided pixels are added to each other and subjected to AD conversion. At this time, the range of the input to the AD converter is so clipped as to be always equal to or lower than the saturated output voltages of the respective pixels so that the output value of each pixel may be invariably a certain digital value.

This is the end of the description of specific examples of the pixel division.

Addition processing of divided-pixel signals in the AD converter according to the present embodiment will be described below.

Figure 14A:
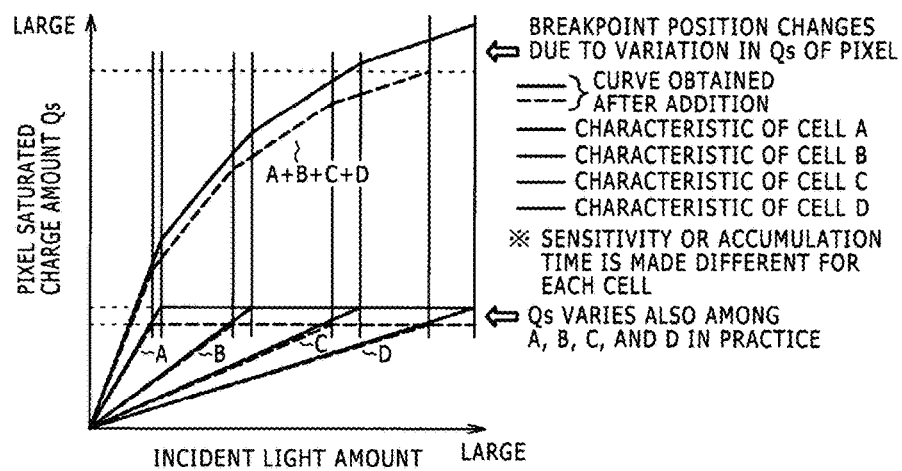
FIGS. 14A and 14B are diagrams showing addition of divided-pixel signals with characteristic comparison between a related-art system and a system according to the embodiment of the present invention.
Figure 14B:
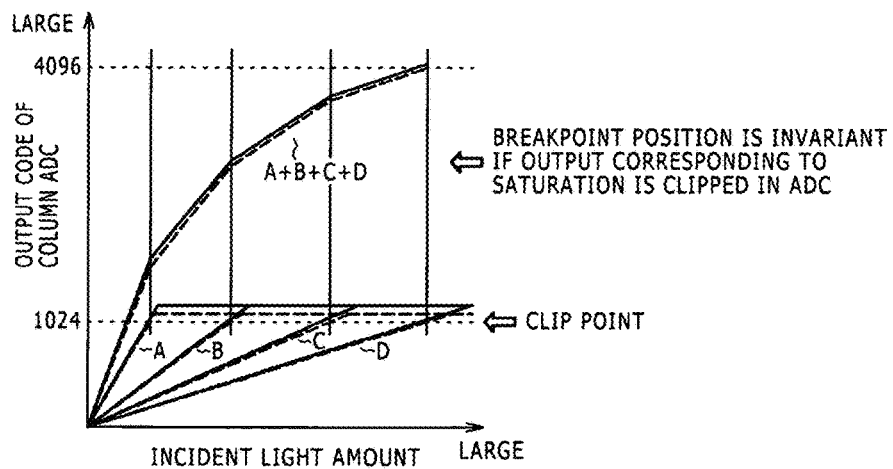

FIGS. 14A and 14B are diagrams showing addition of divided-pixel signals with characteristic comparison between the related-art system and the system according to the embodiment of the present invention.

FIG. 14A is a diagram showing the result of addition of divided-pixel signals by the related-art system.

In the case of FIG. 14A, divided pixels are driven with use of the structure like that shown in FIG. 10 or FIG. 12 to thereby read out signals from the divided pixels having different sensitivities to the shared floating diffusion part SFD and output the signals to the signal line after signal addition in the shared floating diffusion part SFD.

FIG. 14A shows the result of detection and graphing of the saturated charge amounts of the divided pixels with respect to the amount of incident light to the pixel. In this addition method, the knee characteristic is achieved.

However, because the signal addition is carried out in the shared floating diffusion part SFD and the range of the input to the AD converter is not so clipped as to be equal to or lower than the saturated output voltages of the respective pixels, the saturated charge amount Qs varies from pixel to pixel attributed to the manufacturing process.

This leads to a defect that the addition result also varies as indicated by the dashed line corresponding to the ideal curve and the full line corresponding to the actual characteristic.

FIG. 14B is a diagram showing an addition result obtained by the system according to the embodiment of the present invention.

In this system, the detection is carried out based on not the saturated charge amount Qs but the output code of the column AD converter. FIG. 14B shows the result of the detection.

As shown in the diagram, for the number of output electrons of the column AD converter at the time of the saturation of the respective divided pixels, a clip point is appropriately set at the number of electrons obtained before the saturation of any divided pixel.

Thereby, the number of output electrons is equally set for the respective divided pixels.

Therefore, the addition result free from variation is achieved as shown in FIG. 14B.

In other words, even if the pixels involve variation in the saturated charge amount, using this novel addition system can always offer the sensitivity characteristic free from variation.

The bit accuracy of the AD conversion will be described below.

FIG. 15 is a diagram showing an example of A/D conversion for divided pixels with different bit accuracies.

Specifically, in the example of FIG. 15, one pixel under a same-color color filter is divided into four divided pixels different from each other in the photosensitivity or the accumulation time, and A/D conversion is carried out with bit accuracies different for each divided pixel.

For example, when assigning higher resolution and lower resolution to the smaller light amount side and the larger light amount side, respectively, is intended, the resolutions are set to 4 bit, 3 bit, 3 bit, and 2 bit in that order from the smaller light amount side toward the larger light amount side, as shown in FIG. 15.

FIG. 16 is a diagram showing the numbers of bits that can be set for the respective divided pixels when the divided pixels are subjected to A/D conversion with different bit accuracies and the lowest resolution of each pixel is assumed to be 1 bit.

The right end of FIG. 16 shows the total number of clocks for four divided pixels. As shown in the last row, the total number of clocks is 36, which is the smallest, when the respective resolutions are set to 4 bit, 3 bit, 3 bit, and 2 bit.

Figure 17A:
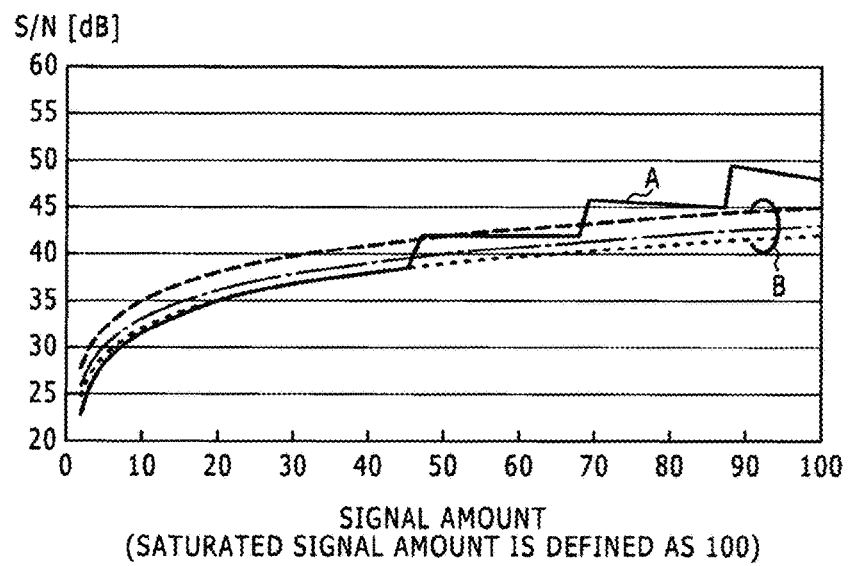
FIGS. 17A and 17B are diagrams showing the results of simulation of the S/N in divided-pixel addition and in a normal pixel in consideration of electrons and the voltage conversion efficiency.
Figure 17B:
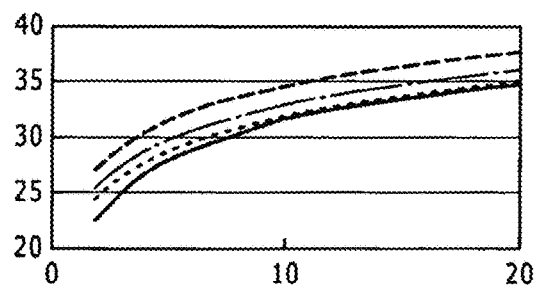

FIGS. 17A and 17B are diagrams showing the results of simulation of the S/N in divided-pixel addition and in a normal pixel in consideration of electrons and the voltage conversion efficiency.

FIG. 17B is a diagram showing the results on the smaller signal amount side in an enlarged manner.

In FIGS. 17A and 17B, when the signal amount is plotted on the abscissa and the S/N is plotted on the ordinate with the saturated signal amount defined as 100, the result about the pixel addition corresponds to the characteristic curve indicated by heavy full line A and the result about the normal pixel corresponds to curves indicated by dashed line and chain line B.

When the light amount is in a range from a small amount to a middle amount, the S/N is lower in the pixel addition than in the normal pixel, for which division is not carried out. However, when the light amount is larger than the middle amount, there are three points at which the graph of the pixel addition sharply rises up, which shows that the S/N is enhanced.

The reason for this is as follows. Specifically, in the case of the AD addition, the AD conversion is stopped at the timing when the divided pixel is saturated (at the clip point). Therefore, at the timing when the second pixel addition is carried out, shot noise (noise attributed to the circuit) of the first pixel is not reflected in the second pixel addition.

Similarly, shot noise of the second pixel is not carried over in the third addition and shot noise of the third pixel is not reflected in the fourth addition. Thus, the S/N value jumps and is suddenly enhanced at the timing of the addition, which is a novel fact.

As the addition method at the time of the AD conversion, a method is employed in which the addition of the signals of the respective divided pixels is carried out after the AD conversion is stopped at the clip point. Thus, this method can be applied also to a parallel drive method like that shown in FIG. 18 in addition to the time-sequential drive method like that shown in FIG. 6.

Also in the case of the parallel driving, column AD conversion is stopped at the clip point after amplification of the signals of the respective pixels, and therefore shot noise of the pixel is not carried over in the next addition. Accordingly, an S/N characteristic curve like that indicated by heavy full line A in FIG. 17A can be achieved.

Figure 18:
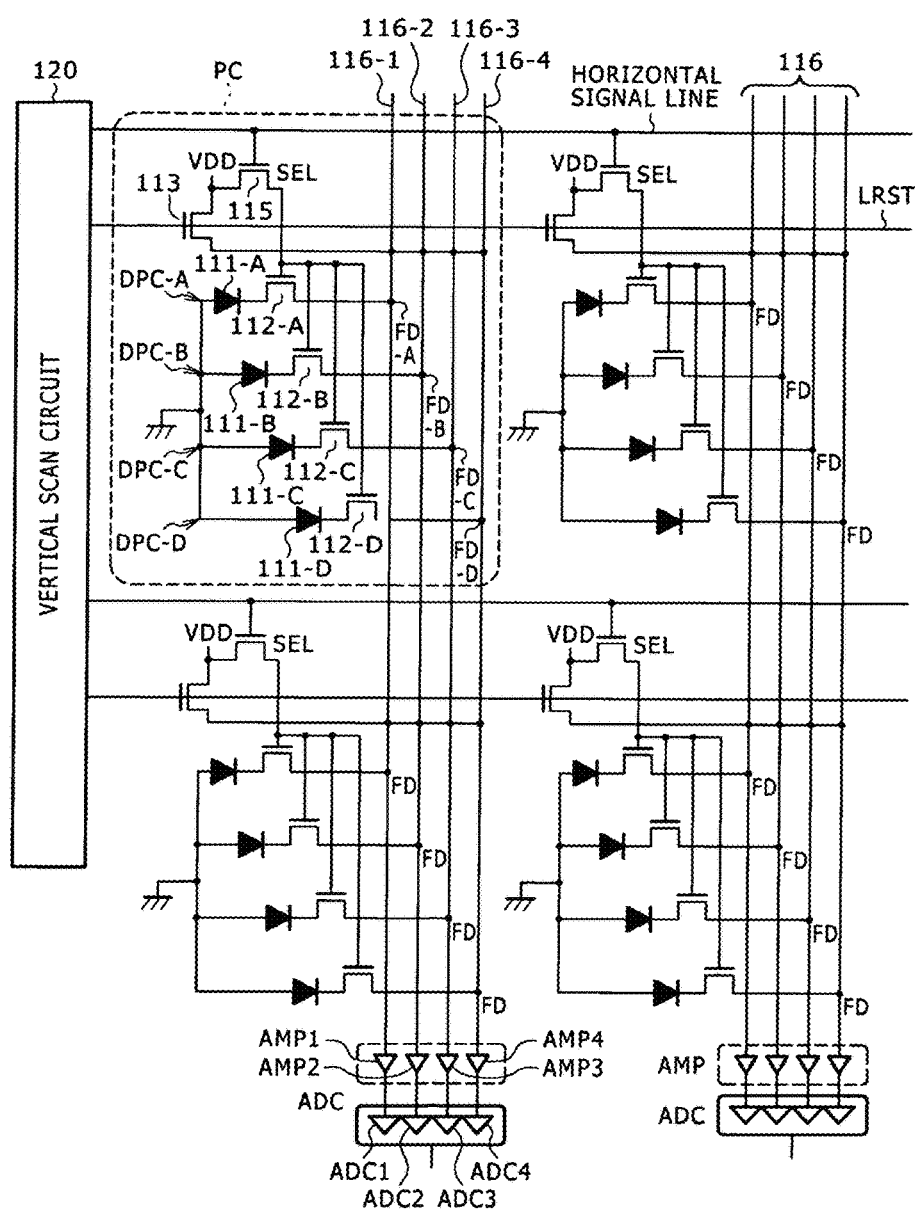
FIG. 18 is a diagram showing a configuration example of a divided-pixel addition equivalent circuit to which a parallel drive method according to the embodiment of the present invention is applied.

FIG. 18 is a diagram showing a configuration example of a divided-pixel addition equivalent circuit to which a parallel drive method according to the embodiment of the present invention is applied.

FIG. 18 is an equivalent circuit diagram of the photosensitive pixel unit in the Bayer-array CMOS image sensor shown in FIG. 13.

In this system, signals detected in the floating diffusion parts FD are not amplified in the pixel unit but amplified in the column pixel readout unit.

Signals detected in four pixel regions having different photosensitive characteristics are output via the respective floating diffusion parts FD to four signal lines 116-1 to 116-4 in parallel. The signals are amplified in amplifiers AMP1 to AMP 4 in parallel and are subjected to AD conversion in converters ADC1 to ADC4 in parallel.

The signals from the plural pixel regions having the different photosensitive characteristics are output after being subjected to addition processing in the ADC.

In the above, the divided-pixel addition signal processing is described by taking as an example a solid-state imaging element (CMOS image sensor) including column parallel ADCs.

As the divided-pixel addition signal processing of this so-called column AD conversion type CMOS image sensor, e.g. the following two methods can also be employed.

Figure 19A:
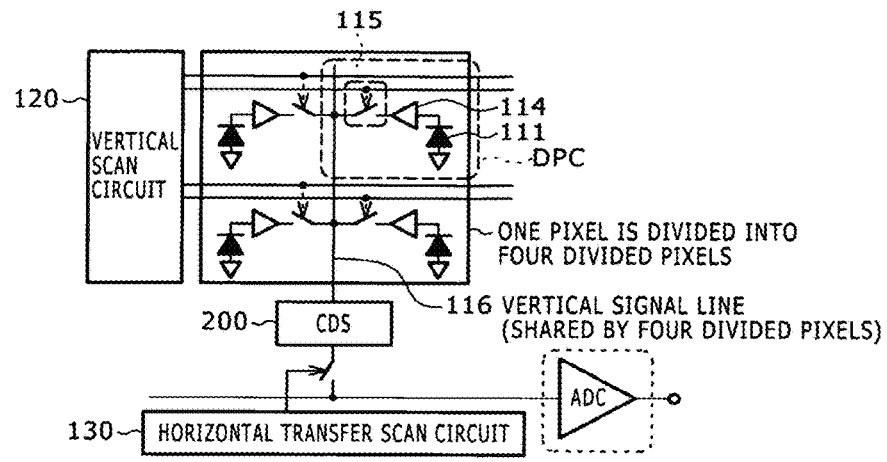
FIGS. 19A and 19B are diagrams schematically showing a configuration example of a column AD conversion type CMOS image sensor circuit relating to divided-pixel addition.

FIG. 19A is a diagram schematically showing a configuration example of a column AD conversion type CMOS image sensor circuit relating to divided-pixel addition.

In FIG. 19A, one pixel under a same-color color filter is divided into four divided pixels, and the photosensitivity or the accumulation time is made different for each divided pixel. Pixel signals are sequentially read out to the same signal line via the shared floating diffusion part FD. Furthermore, noise processing is executed in a CDS circuit 200 provided on each column, and A/D conversion is carried out outside the column on a row-by-row basis.

Figure 19B:
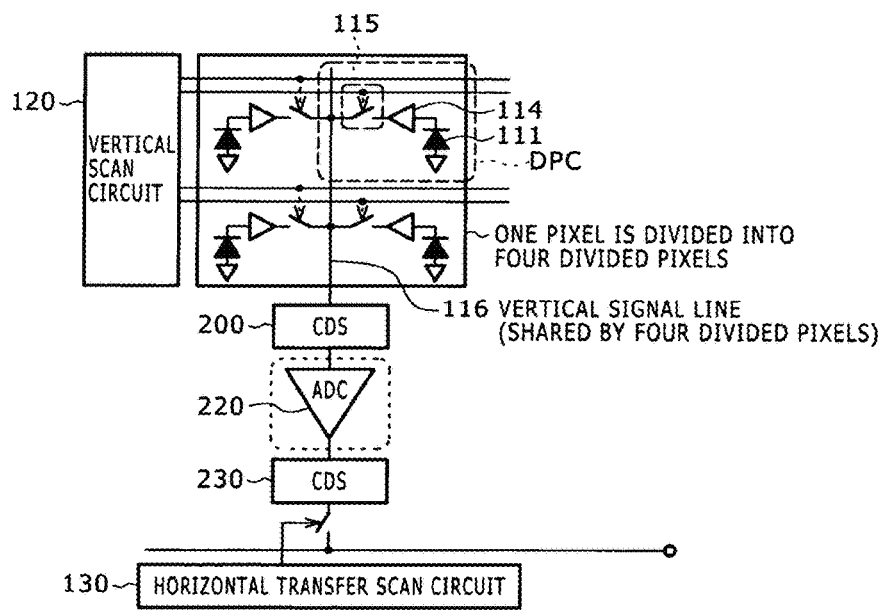

FIG. 19B is a diagram schematically showing another configuration example of the column AD conversion type CMOS image sensor circuit relating to divided-pixel addition.

In the example of FIG. 19B, one pixel under a same-color color filter is divided into four divided pixels, and the photosensitivity or the accumulation time is made different for each divided pixel. Pixel signals are sequentially read out to the same signal line via the shared FD, and first noise processing is executed in a CDS circuit 210 provided on each column.

Thereafter, the analog signal is converted to a digital signal by an A/D converter 220 provided on each column, and second noise processing is executed by a CDS circuit 230 provided on each column to thereby remove digital noise generated in the A/D conversion.

In the above description, the embodiment of the present invention is applied to a CMOS image sensor as an example. However, the embodiment of the present invention can be applied also to a CCD sensor.

FIG. 20 is a diagram showing a configuration example of a solid-state imaging element corresponding to a CCD sensor according to the embodiment of the present invention.

A solid-state imaging element 300 of FIG. 20 has plural sensor parts (photoelectric conversion elements) 311 that are arranged in a matrix along the row (vertical) direction and the column (horizontal) direction and each convert incident light to a signal charge with the charge amount dependent on the incident light amount to accumulate the signal charge.

The solid-state imaging element 300 has plural vertical transfer registers 312 that are each disposed on a respective one of the vertical columns of the sensor parts 311 and vertically transfer the signal charges read out from the respective sensor parts 311 via readout gate parts (not shown). An imaging area 313 is formed by the sensor parts and the vertical transfer registers 312.

The sensor parts 311 employ the Bayer array, and each pixel is divided into divided pixels DPC as plural (e.g. four) regions having different sensitivities.

The vertical transfer registers 312 are driven for transfer by e.g. a three- or four-phase vertical transfer pulse and transfer the signal charges as divided-pixel signals read out from the respective sensor parts 311 in the vertical direction in part of a horizontal blanking period in units of the part corresponding to one scan line (one line) sequentially.

A horizontal transfer register 314 is disposed below the imaging area 313 in the diagram. To the horizontal transfer register 314, the signal charges as the divided-pixel signals corresponding to one line are sequentially transferred from each of the plural vertical transfer registers 312.

The horizontal transfer register 314 is driven for transfer by e.g. a three- or four-phase horizontal transfer pulse and sequentially transfers the signal charges corresponding to one line, transferred from the plural vertical transfer registers 312, in the horizontal direction in a horizontal scanning period after a horizontal blanking period.

A charge detector 315 having e.g. a floating diffusion amplifier configuration is disposed at the end of the horizontal transfer register 314 on the transfer destination side.

This charge detector 315 has a floating diffusion part FD that accumulates a signal charge supplied from the horizontal transfer register 314 via a horizontal output gate part. The charge detector 315 includes a reset drain (RD) for discharging a signal charge and a reset gate (RG) disposed between the floating diffusion part FD and the reset drain, although not shown in the drawing.

In this charge detector 315, a predetermined reset drain voltage is applied to the reset drain, and a reset pulse is applied to the reset gate with the detection cycle of the signal charge.

The signal charge accumulated in the floating diffusion part FD is converted to a signal voltage and led to a CDS circuit 320 via an output circuit 316 as a CCD output signal CCDout. Furthermore, AD conversion and addition processing of the respective divided-pixel signals are carried out in an ADC 330.

As described above, in the present embodiment, plural regions (divided pixels) different from each other in the photosensitive characteristic or the accumulation time are disposed in one pixel, and pixel signals thereof are sent to the vertical signal line and added to each other in the AD conversion unit provided in the column unit.

At this time, the range of the input of the respective pixel signals to the AD converter is so set as to be equal to or lower than the saturated output voltages of the individual divided pixels.

Therefore, the present embodiment can achieve the following advantages.

Pixels of a wide dynamic range solid-state imaging element that has high sensitivity when the light amount is small and has a high-luminance information compression characteristic can be realized.

Furthermore, an external memory is unnecessary differently from existing digital addition.

Variation in the breakpoint, which is the point at which any of the pixels as the addition subjects is saturated, involved in analog addition, is also absent.

The S/N is enhanced at the breakpoint (the point at which any of the pixels as the addition subjects is saturated), and the S/N equal to or higher than that of a non-divided pixel can be achieved when the luminance is equal to or higher than middle luminance.

In addition, the divided pixel structure can be achieved without much increasing the number of processes.

Moreover, it is also possible to employ a configuration that allows switching to readout in which the respective divided pixels are independently read out for obtaining a high-resolution image according to the specification.

The solid-state imaging element having these advantageous features can be used as an imaging device in a digital camera and a video camera.

Figure 21:
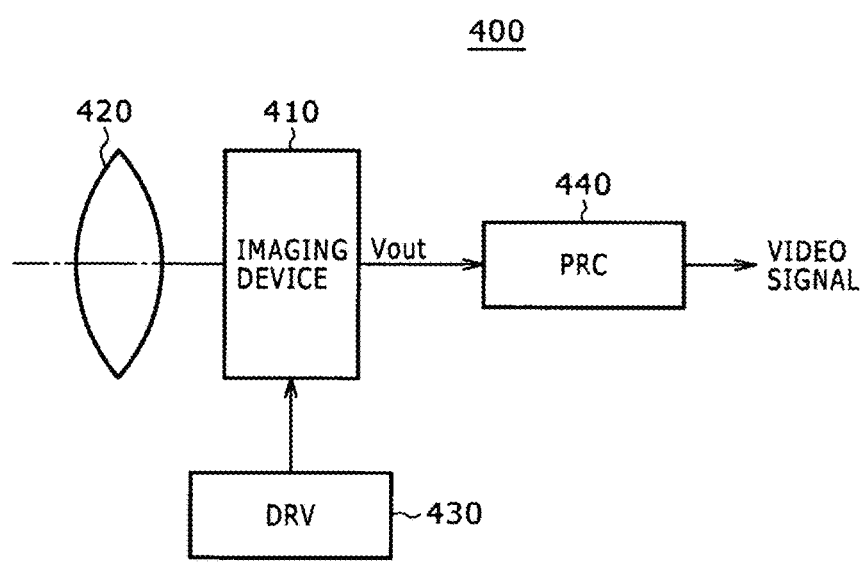
FIG. 21 is a diagram showing one example of the configuration of a camera system to which the solid-state imaging element according to the embodiment of the present invention is applied.

FIG. 21 is a diagram showing one example of the configuration of a camera system to which the solid-state imaging element according to the embodiment of the present invention is applied.

As shown in FIG. 21, this camera system 400 includes an imaging device 410 to which the CMOS image sensor (solid-state imaging element) 100, 300 according to the present embodiment can be applied. The camera system 400 further includes an optical system for guiding incident light to the pixel region of the imaging device 410 (forming a subject image), such as a lens 420 for focusing incident light (image light) on the imaging plane. The camera system 400 further includes a drive circuit (DRV) 430 for driving the imaging device 410 and a signal processing circuit (PRC) 440 for processing an output signal from the imaging device 410.

The drive circuit 430 has a timing generator (not shown) that produces various kinds of timing signals including start pulse and clock pulse for driving the circuit in the imaging device 410, and drives the imaging device 410 by the predetermined timing signal.

The signal processing circuit 440 executes signal processing such as CDS for the output signal from the imaging device 410.

The image signal resulting from the processing by the signal processing circuit 440 is recorded in a recording medium such as a memory. The image information recorded in the recording medium is output as a hard copy by a printer or the like. Furthermore, the image signal resulting from the processing by the signal processing circuit 440 is displayed as a moving image on a monitor formed of e.g. a liquid crystal display.

As described above, a low-power-consumption, high-accuracy camera can be realized by incorporating the above-described imaging element 100 as the imaging device 410 in imaging apparatus such as a digital still camera.

The present application contains subject matter related to that disclosed in Japanese Priority Patent Application JP 2008-187026 filed in the Japan Patent Office on Jul. 18, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device, comprising:
    a pixel array including at least first, second, and third regions, each of the first, second, and third regions having a plurality of transfer transistors and having four portions separated by a channel stop, wherein the four portions are arranged in a 2×2 matrix, each of the four portions having a different photosensitivity;
    a reference signal generator configured to generate a reference signal;
    a first comparator coupled to the first region of the pixel array and configured to compare the reference signal with a first analog signal generated by the first region; and
    a second comparator coupled to the second region of the pixel array and configured to compare the reference signal with a second analog signal generated by the second region, wherein
    each of the four portions of the first region and the second region is configured to receive light transmitted through a green-light-transmitting filter,
    each of the four portions of the third region is configured to receive light transmitted through a blue-light transmitting filter or a red-light transmitting filter,
    the first region is disposed adjacent to the third region in a first direction in a plan view,
    the second region is disposed adjacent to the third region in a second direction perpendicular to the first direction in the plan view,
    the plurality of transfer transistors of each of the first, second and third region comprises a first transfer transistor and a second transfer transistor,
    the first transfer transistor and the second transfer transistor of each of the first, second and third region share one or any combination of one or more of the following: (i) one or more floating diffusions, (ii) one or more select transistors, (iii) one or more reset transistors, (iv) one or more amplification transistors.

2. The imaging device of claim 1, wherein:
    the first transfer transistor and the second transfer transistor of each of the first, second, and third region share a floating diffusion, a reset transistor and an amplification transistor; and
    the floating diffusion is coupled to the reset transistor and to the amplification transistor.

3. The imaging device of claim 2, wherein:
    the first transfer transistor and the second transfer transistor of each of the first, second, and third region share an amplification transistor; and
    the amplification transistor is coupled to a vertical signal line.

4. The imaging device of claim 1, wherein the first transfer transistor and the second transfer transistor of each of the first, second, and third region share two select transistors.

5. The imaging device of claim 1, wherein the channel stop comprises a P-type semiconductor.

6. The imaging device of claim 1, wherein:
    the first comparator is coupled to the first region via a first vertical signal line;
    the second comparator is coupled to the second region via a second vertical signal line; and
    the first vertical signal line is disposed adjacent to the second vertical signal line.

7. The imaging device of claim 1, further comprising:
    a first counter coupled to an output terminal of the first comparator;
    a first latch coupled to an output terminal of the first counter;
    a second counter coupled to an output terminal of the second comparator; and
    a second latch coupled to an output terminal of the second counter.

8. The imaging device of claim 1, wherein at least three of the four portions within each of the first, second and third regions includes an optical attenuation structure configured to provide the different photosensitivities for the four portions.

9. The imaging device of claim 8, wherein each of the four portions within each of the first, second and third regions includes an optical attenuation structure configured to provide the different photosensitivities for the four portions.

10. The imaging device of 19, wherein the optical attenuation structure comprises a light blocking film, and wherein the light blocking film for each of the at least three of the four portions has a different transmittance.

11. An imaging device, comprising:
    a pixel array including at least first, second, and third regions, each of the first, second, and third regions having a plurality of transfer transistors and having four portions separated by a channel stop, each of the four portions being rectangular-shaped in a plan view;
    a reference signal generator configured to generate a reference signal;
    a first comparator coupled to the first region of the pixel array and configured to compare the reference signal with a first analog signal generated by the first region; and
    a second comparator coupled to the second region of the pixel array and configured to compare the reference signal with a second analog signal generated by the second region, wherein
    each of the four portions of the first region and the second region is configured to receive light transmitted through a green-light-transmitting filter, each of the four portions of the third region is configured to receive light transmitted through a blue-light transmitting filter or a red-light transmitting filter, the first region is disposed adjacent to the third region in a first direction in the plan view, the second region is disposed adjacent to the third region in a second direction perpendicular to the first direction in the plan view, the plurality of transfer transistors of each of the first, second, and third region comprises a first transfer transistor and a second transfer transistor, the first transfer transistor and the second transfer transistor of each of the first, second, and third region share one or any combination of one or more of the following: (i) one or more floating diffusions, (ii) one or more select transistors, (iii) one or more reset transistors, (iv) one or more amplification transistors.

12. The imaging device of claim 11, wherein:
the first transfer transistor and the second transfer transistor of each of the first, second, and third region share a floating diffusion, a reset transistor and an amplification transistor; and
the floating diffusion is coupled to the reset transistor and to the amplification transistor.

13. The imaging device of claim 12, wherein:
the first transfer transistor and the second transfer transistor of each of the first, second, and third region share an amplification transistor; and
the amplification transistor is coupled to a vertical signal line.

14. The imaging device of claim 11, wherein
the first transfer transistor and the second transfer transistor of each of the first, second, and third region share two select transistors.

15. The imaging device of claim 11, wherein
the channel stop comprises a P-type semiconductor.

16. The imaging device of claim 11, wherein:
the first comparator is coupled to the first region via a first vertical signal line;
the second comparator is coupled to the second region via a second vertical signal line; and
the first vertical signal line is disposed adjacent to the second vertical signal line.

17. The imaging device of claim 11, further comprising:
a first counter coupled to an output terminal of the first comparator;
a first latch coupled to an output terminal of the first counter;
a second counter coupled to an output terminal of the second comparator; and
a second latch coupled to an output terminal of the second counter.

18. The imaging device of claim 11, wherein within each of the first, second, and third regions, the four portions have different photosensitivities.

19. The imaging device of claim 18, wherein at least three of the four portions within each of the first, second and third regions includes an optical attenuation structure configured to provide the different photosensitivities for the four portions,
wherein each of the four portions within each of the first, second and third regions includes an optical attenuation structure configured to provide the different photosensitivities for the four portions.

20. The imaging device of 36, wherein the optical attenuation structure comprises a light blocking film, and wherein the light blocking film for each of the at least three of the four portions has a different transmittance.

* * * * *